United States Patent
Xie et al.

(10) Patent No.: US 11,088,288 B2
(45) Date of Patent: Aug. 10, 2021

(54) STACKED-NANOSHEET SEMICONDUCTOR STRUCTURES WITH SUPPORT STRUCTURES

(71) Applicant: International Business Machines Corporation, Armonk, NY (US)

(72) Inventors: Ruilong Xie, Niskayuna, NY (US); Jingyun Zhang, Albany, NY (US); Xin Miao, Slingerlands, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/570,150

(22) Filed: Sep. 13, 2019

(65) Prior Publication Data

US 2021/0083127 A1 Mar. 18, 2021

(51) Int. Cl.
*H01L 29/06* (2006.01)
*H01L 29/78* (2006.01)
*H01L 29/786* (2006.01)

(52) U.S. Cl.
CPC .... *H01L 29/78696* (2013.01); *H01L 29/0665* (2013.01); *H01L 29/7851* (2013.01)

(58) Field of Classification Search
CPC .......... H01L 29/78696; H01L 29/0665; H01L 29/7851
See application file for complete search history.

(56) References Cited

U.S. PATENT DOCUMENTS

| | | | |
|---|---|---|---|
| 6,440,801 B1 | 8/2002 | Furukawa | |
| 2003/0040158 A1 | 2/2003 | Saitoh | |
| 2013/0341704 A1 | 12/2013 | Rachmady | |
| 2016/0086968 A1 | 3/2016 | Yang et al. | |
| 2016/0118304 A1* | 4/2016 | Zang | H01L 29/42392 438/694 |
| 2017/0236836 A1 | 8/2017 | Huo et al. | |
| 2018/0350993 A1 | 12/2018 | Chang et al. | |
| 2018/0351001 A1 | 12/2018 | Zhang et al. | |
| 2019/0267463 A1* | 8/2019 | Chao | H01L 29/0653 |
| 2020/0020690 A1* | 1/2020 | Ando | H01L 29/0673 |
| 2020/0152734 A1* | 5/2020 | Frougier | H01L 29/775 |

FOREIGN PATENT DOCUMENTS

WO   2017181404 A1   10/2017

OTHER PUBLICATIONS

Loubet et al., "Stacked nanosheet gate-all-around transistor to enable scaling beyond FinFET", Research Gate, Conference: 2017 Symposium on VLSI Technology, Jun. 2017, 3 pages.

* cited by examiner

*Primary Examiner* — Kyoung Lee
*Assistant Examiner* — Christina A Sylvia
(74) *Attorney, Agent, or Firm* — Erika R. DeCosty

(57) ABSTRACT

A semiconductor structure and formation thereof. The semiconductor structure including: a nano-sheet field-effect transistor; a layer of support material that is located beneath a stack of nano-sheets that are included in the nano-sheet field-effect transistor; and a vertical support that is affixed to a stack of nano-sheets, wherein the vertical support (i) has an end that is affixed to the layer of support material and (ii) a side that is a affixed to at least one nano-sheet of the stack of nano-sheets.

16 Claims, 21 Drawing Sheets

STACKED-NANOSHEET SEMICONDUCTOR STRUCTURES WITH SUPPORT STRUCTURES

BACKGROUND

The present invention relates generally to the field of semiconductor devices, and more particularly to formation of horizontally stacked nanosheet structures.

In nanometer scale devices, gate structures are often disposed between fin structures or other conducting structures, such as nanosheets. In many instances, the conducting or semiconducting structures are formed closer together due to scaling to smaller node technology sizes. This can be a limiting factor in the reduction of the device size scaling.

While nanosheets can benefit from tight device-device spacing, these dimensions may limit scaling of these devices. Further, the deformation or bending of nanosheets can be of great concern, especially for long channel devices in which the nanosheets are suspended across relatively long distances after channel release. Such, inconsistencies can greatly impact yields of semiconductor devices and/or lead to unacceptable variations in electrical characteristics of semiconductor devices.

SUMMARY

According to one embodiment of the present disclosure, a semiconductor structure is provided. The semiconductor structure includes: a nano-sheet field-effect transistor; a layer of support material that is located beneath a stack of nano-sheets that are included in the nano-sheet field-effect transistor; and a vertical support that is affixed to a stack of nano-sheets, wherein the vertical support (i) has an end that is affixed to the layer of support material and (ii) a side that is a affixed to at least one nano-sheet of the stack of nano-sheets.

According to one embodiment of the present disclosure, a method of forming a semiconductor structure is provided. The method includes: forming a layer of support material; forming a stack of nano-sheets over the layer of support material; and forming a vertical support with (i) a bottom that is affixed to layer of support material and (ii) a side that is affixed to at least one nano-sheet of the stack of nano-sheets.

BRIEF DESCRIPTION OF THE DRAWINGS

The following detailed description, given by way of example and not intend to limit the disclosure solely thereto, will best be appreciated in conjunction with the accompanying drawings, in which:

When viewed as ordered combinations, FIGS. 1-18E illustrate both (i) semiconductor devices with support structures and (ii) the methods for forming such semiconductor devices with support structures, in accordance with illustrative embodiments.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
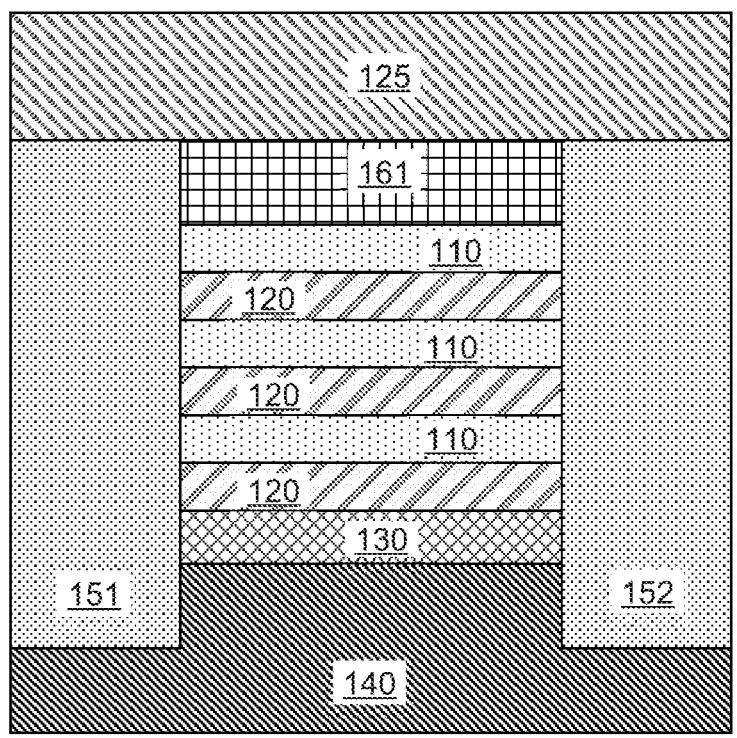
FIG. 1 illustrates a cross-sectional view depicting formation of an initial nanosheet structure that includes a stack of material layers with alternating layers of silicon channels and layers of sacrificial SiGe material.

The present invention recognizes the formation of horizontally stacked gate-all-around (GAA) nanosheet structures. Embodiments of the present invention recognize that the deformation or bending of the sheets can be of great concern especially for long channel when the sheets are suspended across long distances after channel release. Embodiments of the present invention recognize that stiction between nanosheets can lead to deformation, e.g., bending, of the nanosheets that leads to inconsistent spacing between nanosheets. Embodiments of the present invention recognize that inconsistent spacing between nanosheets may result in inconsistent gate thickness between nanosheets for horizontally stacked GAA nanosheet structures.

Embodiments of the present invention provide support structures that support nanosheets after channel release. Embodiments of the present invention recognize the limited space that is often allotted for a given nanosheet device on an integrated circuit, i.e., the allotted footprint. As such, Embodiments of the present invention provide support structures that provide for a minimized impact on that footprint such that only a small portion of the available footprint is consumed by the support structure.

Exemplary embodiments now will be described more fully herein with reference to the accompanying drawings, in which exemplary embodiments are shown. In the following detailed description, numerous specific details are set forth in order to provide a thorough understanding of various embodiments of the invention. However, it is to be understood that embodiments of the invention may be practiced without these specific details. As such, this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

As described below, in conjunction with FIGS. 1-20C, embodiments may include semiconductor structures and methods of forming a semiconductor device with at least one support structure. The methods described below in conjunction with FIGS. 1-20C may be incorporated into typical semiconductor fabrication processes, such as fabrication processes. As such, when viewed as ordered combinations, FIGS. 1-20C illustrate methods for forming semiconductor devices with support structures, in accordance with illustrative embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is focused on the distinctive features or elements of various embodiments of the present invention.

As used herein, semiconductor structures refer to one or more physical structures that comprise semiconductor devices.

As used herein, terms such as "depositing", "forming", and the like may refer to the disposition of layers, or portions of materials, in accordance with a given embodiment. Such processes may or may not be different than those used in the standard practice of the art of semiconductor device fabrication. Such processes include, but are not limited to, atomic layer deposition (ALD), molecular layer deposition (MLD), chemical vapor deposition (CVD), low-pressure chemical vapor deposition (LPCVD), plasma enhanced chemical vapor deposition (PECVD), limited reaction processing CVD (LRPCVD), ultrahigh vacuum chemical vapor deposition (UHVCVD), metalorganic chemical vapor deposition (MOCVD), physical vapor deposition, sputtering, plating, evaporation, ion beam deposition, electron beam deposition, laser assisted deposition, chemical solution deposition, or any combination of those methods.

As used herein, terms, such as "forming," and the like, may refer to processes that alter the structure and/or composition of one or more layers of material or portions of materials in accordance with a given embodiment. For example, such formation processes may include, but are not limited to, exposure to a specific frequency or range of frequencies of electromagnetic radiation, ion implantation techniques, and/or chemical/mechanical polishing (CMP). As used herein, terms, such as "forming," and the like, may refer to processes that alter the structure of one or more layers of material, or portions of material(s), by removal of a quantity of material, in accordance with a given embodiment. For example, such formation processes may include, but are not limited to, wet and/or dry etching processes, plasma etching processes, or any of the known etching processes in which material is removed.

Those skilled in the art understand that many different techniques may be used to add, remove, and/or alter various materials, and portions thereof, and that embodiments of the present invention may leverage combinations of such processes to produce the structures disclosed herein without deviating from the scope of the present invention.

Certain embodiments of the present invention comprise nano-sheet FET devices, which include stacks of nano-sheets of various materials, e.g., lateral nano-sheets (LNS, also known as horizontal nano-sheets or HNS). HNS may be considered variations of horizontal nano-wires (HNW) with the wires widened. The HNS may be epitaxial-silicon grown and be separated by sacrificial silicon-germanium (SiGe) spacer layers. Certain embodiments of the present invention comprise integrated circuits comprising at least one horizontal nanosheet (HNS) devices on a top surface of a substrate with an attached/integrated vertical support structure that extends in a vertical direction relative to the integrated circuit, i.e., is vertical relative to the horizontal substrate.

As the size of integrated circuits decreases, it has become desirable to increase the density of the FETs on a substrate. Horizontal nanosheet field-effect transistor (HNS-FET) devices include multiple horizontal nanosheets serving as conducting channel regions to enable larger effective conduction width in a small layout area overlying a substrate. There are often several desired features that can be provided by certain HNS-FET structures. For example, the channel thickness of an HNS-FET can be finely tuned, and two or more nanosheets can be stacked over one another at the same layout area. However, the more tightly packed the HNS-FET become the smaller space per HNS-FET, e.g., the footprint allotted per HNS-FET shrinks as HNS-FET density increases over the surface of the wafer.

It may also be highly desirable to have small vertical spacing (VSP) between adjacent nanosheets in a stack of nanosheets to reduce the parasitic capacitance associated with the HNS-FET, so as to improve circuit speed. For example, the VSP (the thickness between the bottom surface of a first nanosheet and the top surface of an adjacent second nanosheet) may range from 5 nm to 15 nm. However, the VSP must be of a sufficient value to accommodate the gate stack to be formed therein. A gate stack generally includes a work function metal (WFM) that sets the threshold voltage (Vt) of the device, a high-k (HK) gate dielectric material separating the WFM from the nanosheets, and other metals that may be desired to further fine tune the effective work function (eWF) and/or to achieve a desired resistance value associated with current flow through the gate stack in the direction parallel to the plane of the nanosheets. Hereinafter, a "gate dielectric layer", "high-k dielectric layer", and a "HK dielectric layer" are used interchangeably. Due to limitations and in the interest of clarity, certain embodiments herein include WFM and portions of high-k (HK) gate dielectric material can include such WFM. Further, the methods of formation of such structures also include one or more processes for the deposition of such WFM on top of high-k (HK) gate dielectric material before the addition of bulk gate material.

The deposition of the WFM layer may be after the depositing of the high-K dielectric layer, and the deposition of the high-k dielectric layer may be after the trimming of the thickness of the horizontal nanosheets in a stack. The trimming of the thickness may be through a method selected from the group consisting of diluted HF etching, SiCoNi dry etching, chemical oxide removal (COR) process, atomic layer etching, and combinations thereof. The depositing of the WFM layer may be conducted utilizing atomic layer deposition (ALD).

Further, in related integrated circuits with multiple threshold voltage (multiple Vt or mVt) devices, the desired Vt value for each of the HNS devices is achieved by utilizing different work function metals for each of the HNS devices, due to the need of different effective work functions associated with each of the multiple Vt values. As such, the deposition of the WFM for each of the HNS devices may require a separate processing step.

For example, for an n-channel field-effect transistors (nFETs), the WFM layers may include one or more reactive metals (RM) for tuning the Vt by tuning the effective work function (eWF) of the nFETs. For p-channel field-effect transistors (pFETs), the WFM layers may include one or more mid-gap metals (MM) with or without one or more reactive metals (RM) for tuning the Vt of the pFETs. The reactive metal may be any suitable reactive metal, such as Al, Hf, Ti, Zr, La, TiAlC, or any other suitable transition metal for which Vt can be modulated by a change in the thickness of the WFM layer. The mid-gap metal may be any suitable mid-gap metal, such as TaN, TiN, TiTaSiN, or any other suitable metal for which Vt can be modulated by a change in the thickness of the WFM layer. The HK dielectric layer may be formed of any suitable high-k dielectric material, such as $Al_2O_3$ and/or $HfO_2$. The protective layer may be formed of any suitable materials, such as TiN.

The present invention will now be described in detail with reference to the Figures.

FIGS. 1 to 20C include various perspective views and cross-sectional views depicting illustrative steps of a method for manufacturing semiconductor devices and the resulting semiconductor structures according to select embodiments of the present invention. One having ordinary skill in the art appreciates that there are many options available for the formation of the structures described herein and that the following discussion does not limit embodiments to only the techniques described hereinafter.

Referring now to FIG. 1, FIG. 1 illustrates a cross-sectional view depicting formation of an initial nanosheet structure that includes a stack of material layers with alternating layers of silicon channels 110 and layers of sacrificial SiGe material 120 that are formed on a portion of SiGe material 130, which is formed on a substrate 140. In some embodiments, substrate 140 is a silicon on insulator (SOI) substrate and may take the place of SiGe material 130, i.e., SiGe material 130 may not exist since the SOI substrate can be used as a bottom support similar to SiGe material 130 as described herein. It is recognized that silicon channels 110 may be composed of undoped or doped silicon to form a channel for either (i) a nano-sheet n-channel field-effect transistor (n-FET) or (ii) a nano-sheet p-channel field-effect transistor (p-FET).

As seen in FIG. 1, there are portions of shallow trench isolation (STI) oxide material, 151 and 152, that are formed to abut the sides of the stack of material layers. Also depicted is (i) a portion of hard-mask (HM) material 161 that is formed and covers the stack of material layers and (ii) a portion of organic planarization layer (OPL) 125, which (a) in turn covers the portion of HM material 161 and STI oxide material, 151 and 152, and (b) can function as patterning over previously etched features, as is in the case of a dual damascene etch.

With reference to the formation of the semiconductor structures presented with reference to at least FIGS. 17A-20C, certain embodiments include the formation of one or more vertical pillars composed of composed of 65% Silicon-Germanium. The formation of the holes or channels for such vertical pillars, which are vertical extensions of SiGe material 130, may require more select control over etching/removal of various materials. As such, various embodiments are presented herein that provide the needed materials and techniques for etching control to create the needed holes or channels, which are subsequently filled with 65% Silicon-Germanium, to form the aforementioned vertical pillars. For example, vertical pillar 1701 of FIGS. 17A-17B and vertical pillar 2005 of FIGS. 20A-20C.

In some embodiments, organic planarization layer (OPL) 125 represents a stack of material layers. In some such embodiments, OPL 125 represents and further includes an oxide layer separating OPL 125 and HM material 161. In one such embodiment, OPL 125 further includes (i) a resist material, typically comprising a first organic polymer, that is deposited over (ii) an anti-reflective coating (ARC) comprising, for example, a second organic polymer, that is deposited over (iii) a third organic polymer that abuts an oxide layer separating OPL 125 and HM material 161. In general, an ARC material is typically used to reduce reflection during exposure, which can deteriorate the quality of the image being patterned.

In some embodiments, and in accordance with certain lithography techniques, three lithographic-aiding layers are provided in a tri-layer mask stack overlying an oxide layer that overlays the HM material 161. In some such embodiments, the tri-layer mask comprises an Optical Planarizing Layer (OPL) overlying oxide/nitride stacked layers in which the semiconductor device structures are to be patterned, a silicon anti-reflective coating (Si-ARC) layer overlying the OPL, and a photoresist overlying the Si-ARC layer. The tri-layer mask may be provided for patterning the oxide/nitride stacked layers to form a vertical channel through the oxide/nitride stacked layers, including STI oxide material 152, to reach/expose a given portion of SiGe material 130. In accordance with the embodiments presented herein, this given portion of SiGe material 130 may be either (i) underlying or (ii) be adjacent to the areas of oxide/nitride stacked layers that are etched through. Embodiments recognize that OPL 125, including the various layers therein, may further be formed at a predetermined thickness to provide reflectivity and topography control during etching of the oxide layer.

Note that while the illustrative embodiments include silicon channels 110, which are made of silicon, in other embodiments, corresponding structures made be formed of semiconductor materials other than silicon (e.g. germanium, silicon-germanium or III-V).

In one embodiment, STI oxide material 151 and 152 are composed of an oxide material, such as silicon oxide. In general, the steps of such an STI process involves etching a pattern of trenches in silicon, depositing one or more dielectric materials (such as silicon dioxide) to fill the trenches, and removing excess dielectric using a technique such as chemical-mechanical planarization.

In one embodiment, HM material 161 may include a resist or a hard mask patterned using resist, e.g., SiN, TiN, or other hard mask materials. In general, HM material 161 is composed of any material or combinations of materials that will act as a protecting layer for the stack of material layers during the formation of the structures as is depicted and described with reference to FIGS. 2-6.

In one embodiment, OPL 125 can be a self-planarizing organic material that includes carbon, hydrogen, oxygen, and optionally nitrogen, fluorine, and silicon. In one embodiment, the self-planarizing organic material can be a polymer with sufficiently low viscosity so that the top surface of the applied polymer forms a planar horizontal surface. In one embodiment, OPL 125 can include a transparent organic polymer. OPL 125 can be a standard $C_xH_y$ polymer. OPL 125 can be applied, for example, by spin-coating. In one embodiment, the thickness of OPL 125 can be from about 30 nm to about 200 nm, although lesser and greater thicknesses can also be employed.

In this embodiment, SiGe material 120 and SiGe material 130 are composed of Silicon-Germanium (SiGe) (i.e., a molar ratio of silicon and germanium that forms an alloy with the ratio $Si_{1-x}Ge_x$). In this embodiment, layers of silicon channels 110, as well as the sacrificial SiGe material 120 and SiGe material 130 are formed using an epitaxial growth process. The epitaxial process may be selective, meaning no material grows on surfaces covered by, for example a liner material. In this embodiment, such liner portions may later be removed using, for example, a selective wet etching process. However, those skilled in the art understand that many different techniques may be used to remove various materials and portions thereof. In this embodiment, layers of sacrificial SiGe material 120 are composed of 30% Silicon-Germanium. In this embodiment, the portion of SiGe material 130 are composed of 65% Silicon-Germanium. Substrate 140 may be formed of Silicon with a local bottom isolation layer of SiO2. In general, the creation of the stack of layers and other structures depicted in FIG. 1 is accomplished using any combination of known techniques for the deposition of layers of materials known in the arts.

Figure 2:
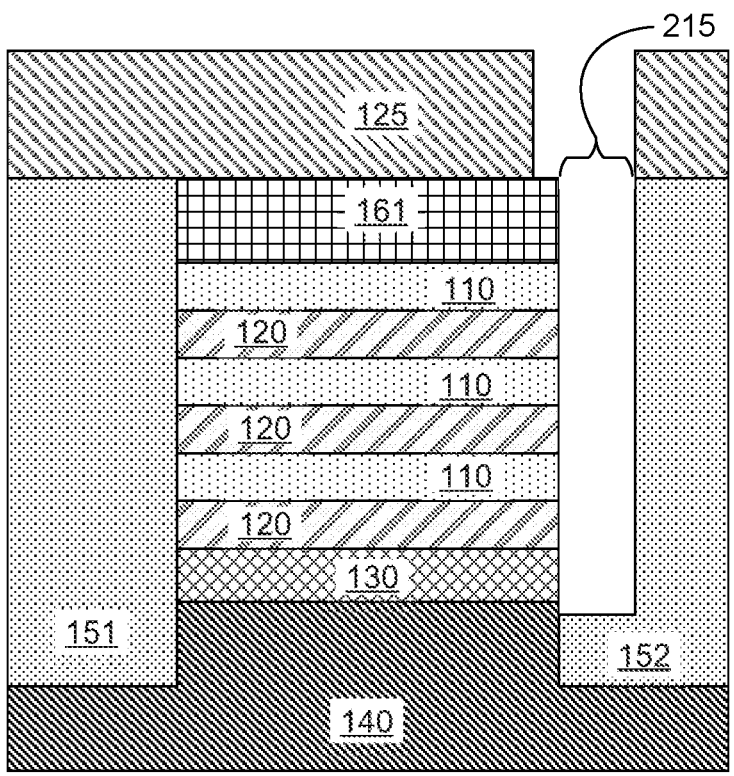
FIG. 2 illustrates a cross-sectional view depicting an etching process for the formation of a vertical trench with a height/length that extends down to and exposes a side of the portion of SiGe material.

FIG. 2 illustrates a cross-sectional view depicting an etching process for the formation of a vertical trench 215 with a height/length that extends down to and exposes a side of the portion of SiGe material 130 in the semiconductor structure of FIG. 1, in accordance with one embodiment. In general, vertical trench 215 has a width 8-15 nm, which minimizes the footprint of the resulting structure while ensuring that the resulting structure provides physical support as explained hereinafter. However, the width of vertical trench 215 may be greater than 15 nm or less than 8 nm in accordance with an embodiment. Note that the depicted width in the opening in OPL 125 is greater than that of vertical trench 215 since HM material 161 inhibited the etching of the materials that are covered by HM material 161. This difference between width in the opening in OPL 125 and that of vertical trench 215 affords a level of error in the placement the opening in OPL 125 such that the center of opening in OPL 125 can be mis-aligned, to within a threshold, with the center of vertical trench 215 during processing. Note that the etching process depicted in FIG. 2 may include one or more types of etching that selectively remove sections of OPL 125 and STI oxide material, 151 and 152.

In some embodiments, HM material 161 extends out and covers a portion of STI oxide material 152. In some embodiments, the semiconductor structure of FIG. 1 further includes a layer of resist material. In one such embodiment, prior to the etching process for the formation of a vertical trench 215, the resist material is exposed, patterned and etched to remove exposed portions of the resist material, in a positive exposure process, although a negative exposure process may be used to pattern the resist. In some such embodiments, after an ARC open step that removes ARC that is not covered by resist material, the semiconductor structure is exposed to another etch process, e.g. an anisotropic etch e.g. in a plasma reactor, to transfer the resist pattern to HM material 161, which forms an opening in/removal of a portion of HM material 161 to allow the etching of STI oxide material 152, as shown and discussed with reference to FIG. 3. Reactive ion etching (ME) may be used to transfer the pattern to HM material 161. Note that in such embodiments, the active areas (AA) are defined as the alternating layers of silicon channels 110 and layers of sacrificial SiGe material 120 areas that are protected by remaining HM material 161 and therefore are not etched. The resist material and the ARC are then removed, e.g., in a dry strip using oxygen plasma.

Figure 3:
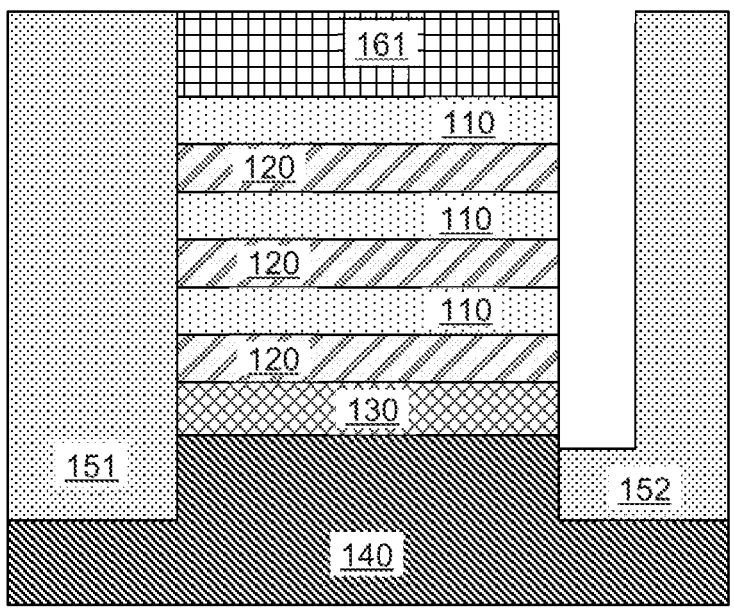
FIG. 3 illustrates a cross-sectional view depicting a semiconductor structure that results from an OPL ash process.

FIG. 3 illustrates a cross-sectional view depicting a semiconductor structure that results from an OPL ash process to remove the remaining portion of OPL 125 from the semiconductor structure of FIG. 2. In some embodiments, the OPL ash process uses an oxygen based ash chemistry that oxidizes the OPL 125. For example, the OPL ash process uses an anisotropic non-selective etching material. The anisotropic non-selective etching material can be an organic ash or a nitrogen- or hydrogen-based chemistry including, for example, nitrogen gas or hydrogen gas, or a combination thereof. In one embodiment, the OPL ash process is a two-step process that includes (i) an oxide etch step that opens an oxide layer and (ii) a second non-selective etch that removes all of the OPL 125 with little or no gouging of the underlying HM material 161.

Figure 4:
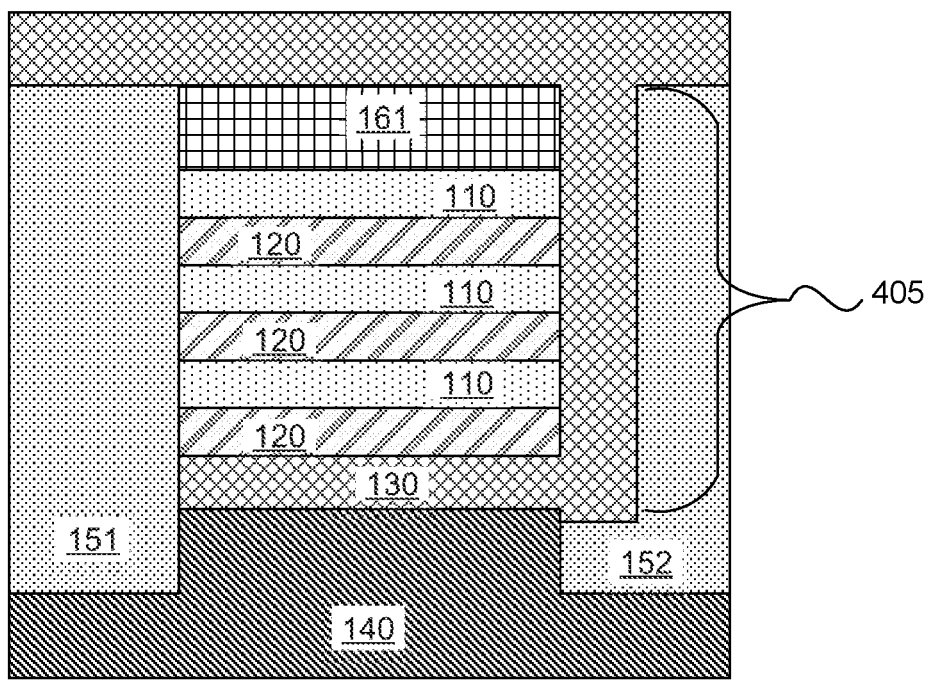
FIG. 4 illustrates a cross-sectional view depicting a semiconductor structure that results from a conformal filling of vertical trench.

FIG. 4 illustrates a cross-sectional view depicting a semiconductor structure that results from a conformal filling of vertical trench 215, of the semiconductor structure of FIG. 3, with additional 65% Silicon-Germanium to form a vertical extension, indicated by bracket 405, of the portion of SiGe material 130. Note that the vertical extension abuts and bonds to the sides of silicon channels 110.

Figure 5:
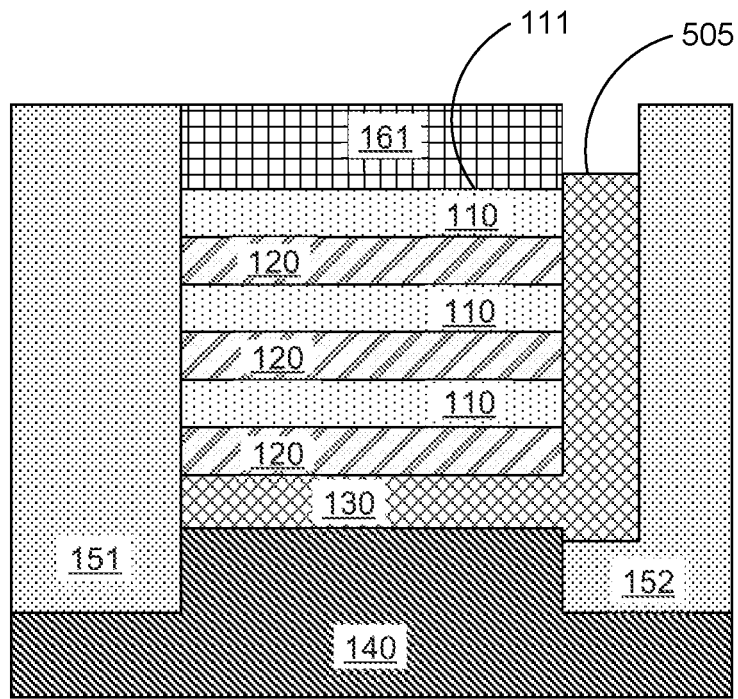
FIG. 5 illustrates a cross-sectional view depicting a semiconductor structure that results from a selective removal of a portion of the additional 65% Silicon-Germanium that results from the conformal filling of the vertical trench.

FIG. 5 illustrates a cross-sectional view depicting a semiconductor structure that results from a selective removal, i.e., a recess etch, of a portion of the additional 65% Silicon-Germanium that was deposited in the process depicted in FIG. 4. Note that the resulting top surface, 505, of the vertical extension of the portion of SiGe material 130 is above the side of the uppermost silicon channel 110, i.e., is above the topmost surface, 111, of the uppermost silicon channel 110. Such a feature may help to ensure that the adhesion between side of the uppermost silicon channel 110 and the vertical extension of the portion of SiGe material 130 is retained during various parts of the manufacturing process.

Figure 6:
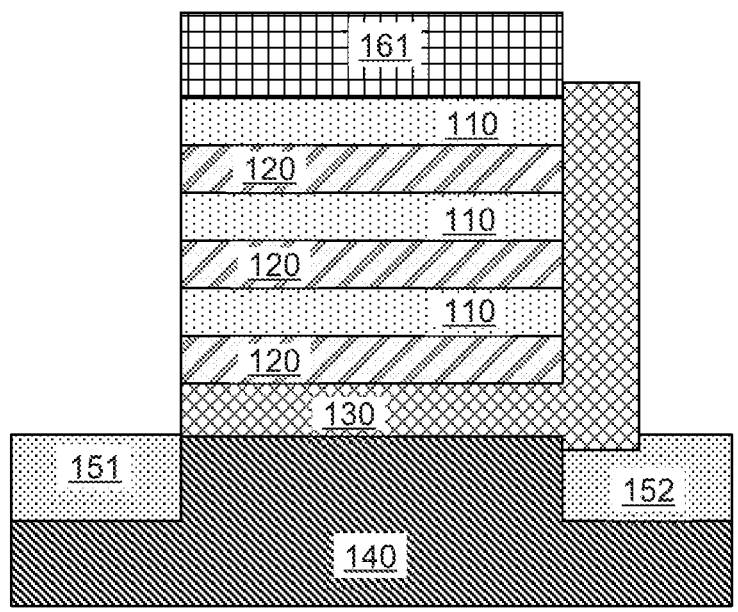
FIG. 6 illustrates a cross-sectional view of depicting a semiconductor structure that results from removal of portions of the remaining STI oxide material.

FIG. 6 illustrates a cross-sectional view of depicting a semiconductor structure that results from removal of portions of the remaining STI oxide material 151 and 152 from the semiconductor structure of FIG. 5. In one embodiment, a selective etching is applied to remove the STI oxide material 151 and 152. For example, a wet chemical etchant for silicon dioxide with a high selectivity over silicon is HF (49% in water). Some plasma etching processes for $SiO_2$ involve at least one of fluorine or carbon atom. $SF_6$, $NF_3$, $CF_4/O_2$, and $CF_4$ are generally isotropic, but can be made more anisotropic with a higher involvement of ion species. Plasma etching of $SiO_2$ may be performed with the injection of a fluorocarbon gas into the processing chamber, where it is ionized and accelerated to the surface for etching. There are many etchants which are selective over Si and are anisotropic, such as $CHF_3/O_2$, $C_2F_6$, $C_3F_8$, and $C_5F_8/CO/O_2/Ar$. High ratios of fluorine atoms versus carbon atoms may be further considerations when achieving a high selectivity of $SiO_2$ over Si.

Figure 7A:
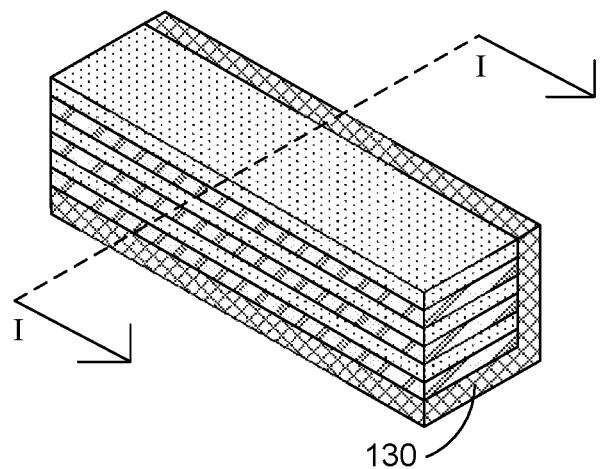
FIGS. 7A-7C illustrate views of a semiconductor structure that results from removal of HM material.

FIG. 7A illustrates a perspective view of a portion of a semiconductor structure that results from removal of HM material 161 from the semiconductor structure of FIG. 6. Note that FIG. 7A excludes certain structures for clarity and that these structures still exist, specifically the remaining portions of STI oxide material 151 and 152 and substrate 140. Note that SiGe material 130 has a distinctive "L" shape that brackets the alternating layers of silicon channels 110 and layers of sacrificial SiGe material 120.

Figure 7B:
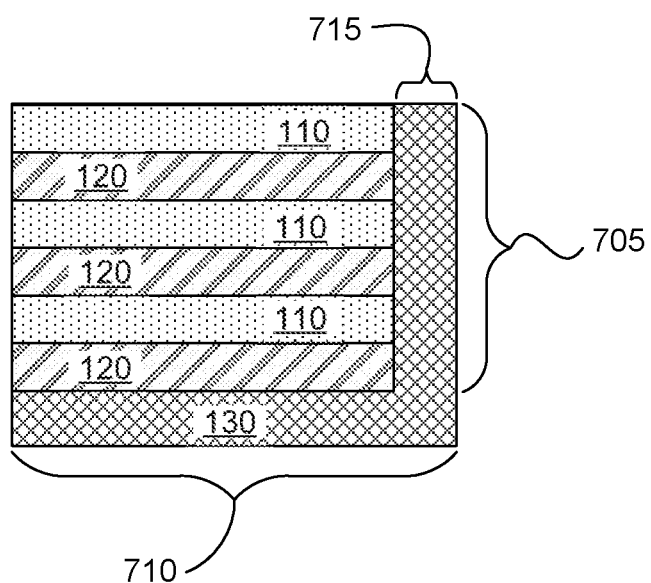

FIG. 7B illustrates a cross-sectional view of semiconductor structure of FIG. 7A taken about the line I-I of FIG. 7A. As shown in FIG. 7B the distinctive "L" shape that abuts the alternating layers of silicon channels 110 and layers of sacrificial SiGe material 120, and has (a) a base portion with a width, denoted by bracket 710, and (b) a vertical portion with (i) a height denoted by bracket 705, and (ii) a width denoted by bracket 715. In this embodiment, as can be understood in light of FIGS. 7A and 7B, the vertical portion of this "L" shaped bracket constitutes a vertical layer of material, similar to a wall, with a height, denoted by bracket 705, that is substantially greater than the width of that vertical portion, denoted by bracket 715.

Figure 7C:
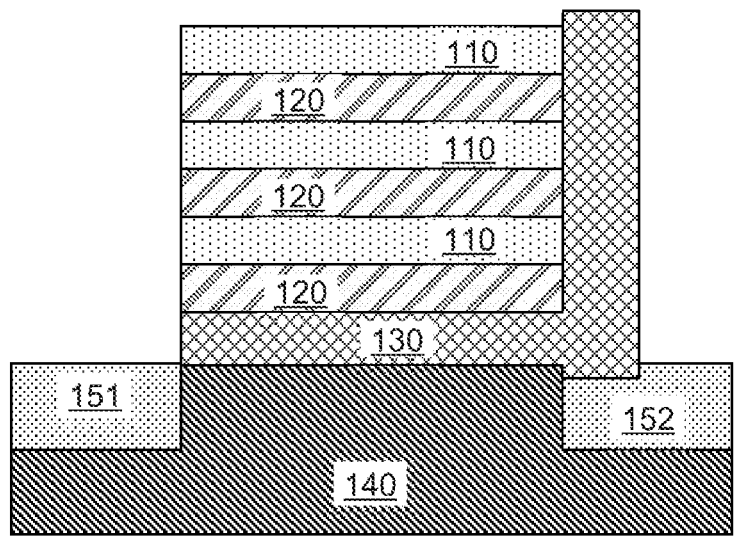

FIG. 7C illustrates a more detailed cross-sectional view of a semiconductor structure that results from removal of HM material 161 from the semiconductor structure of FIG. 6.

Figure 8A:
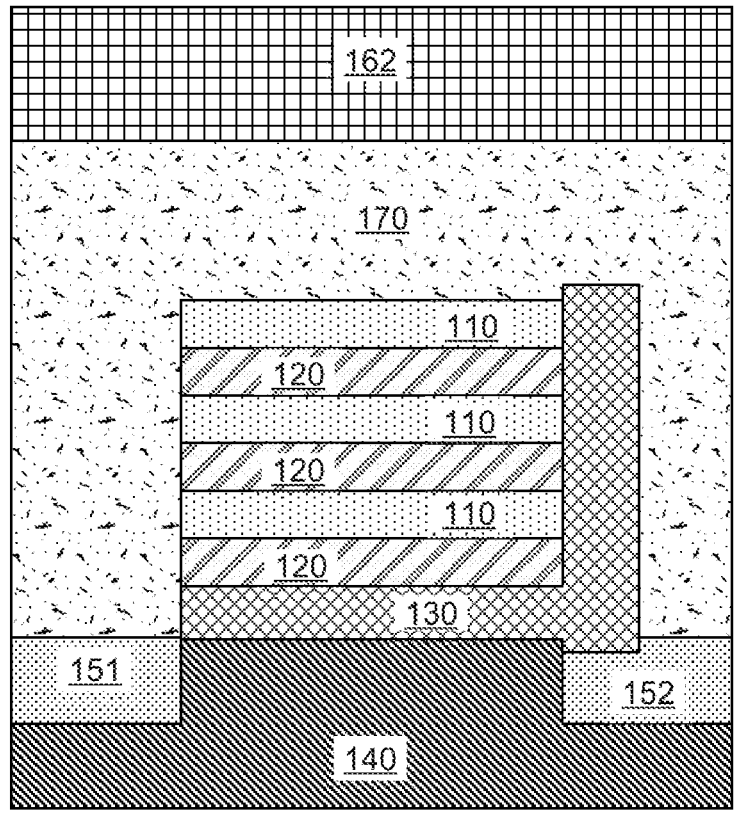
FIGS. 8A-8C illustrates a cross-sectional view of a semiconductor structure that results from the addition of dummy gate followed by a layer of hard mask (HM) material.

FIG. 8A illustrates a cross-sectional view of a semiconductor structure that results from the addition of dummy gate 170 followed by a layer of hard mask (HM) material 162 over the semiconductor structure of FIG. 7C.

HM material 162 may include a resist or a hard mask patterned using resist, e.g., SiN, TiN, or other hard mask materials. In general, HM material 162 is composed of any material or combinations of materials that will act as a protecting layer for the stack of material layers during the formation of the structures as is depicted and described with reference to FIGS. 8A-13B. In one embodiment, dummy gate 170 comprises a portion of dummy gate material, as is known and understood in the art. For example, dummy gate 170 may include polycrystalline silicon, metal oxide, or another dummy gate material known and understood in the art. In some embodiments, dummy gate 170 is made from a material having an opposite work function relative to a given material included in the active area of the semiconductor device.

Figure 8B:
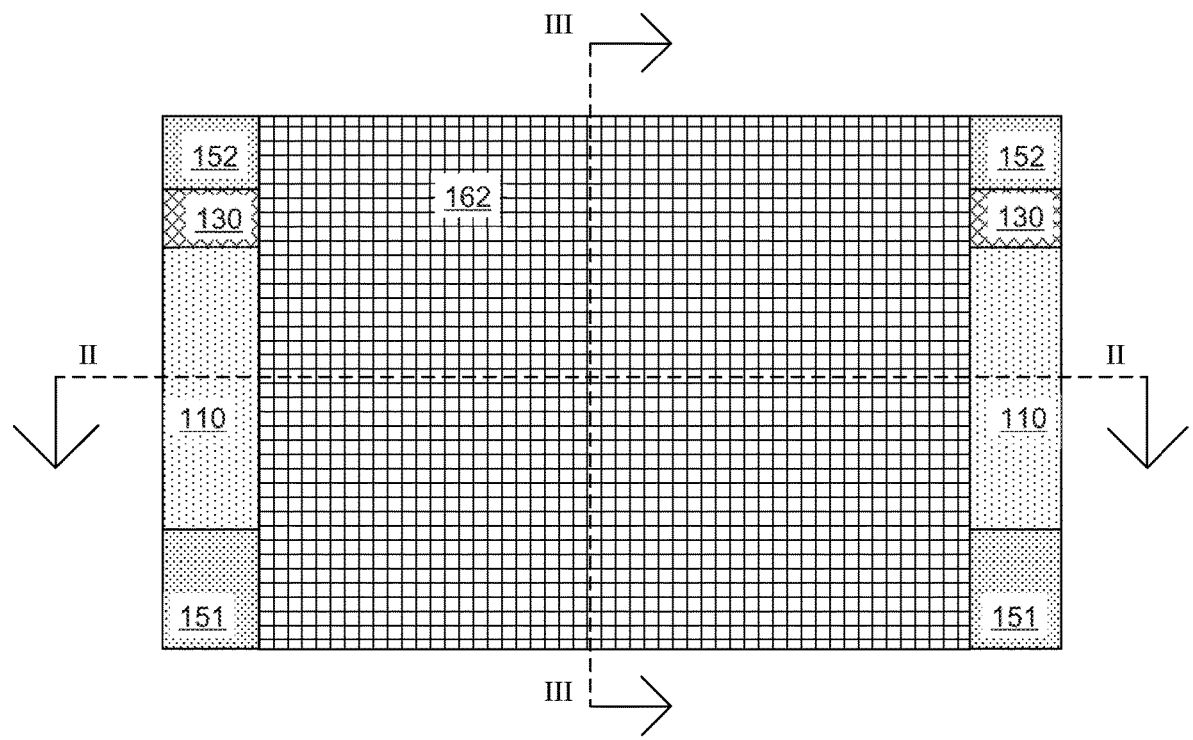
Figure 8C:
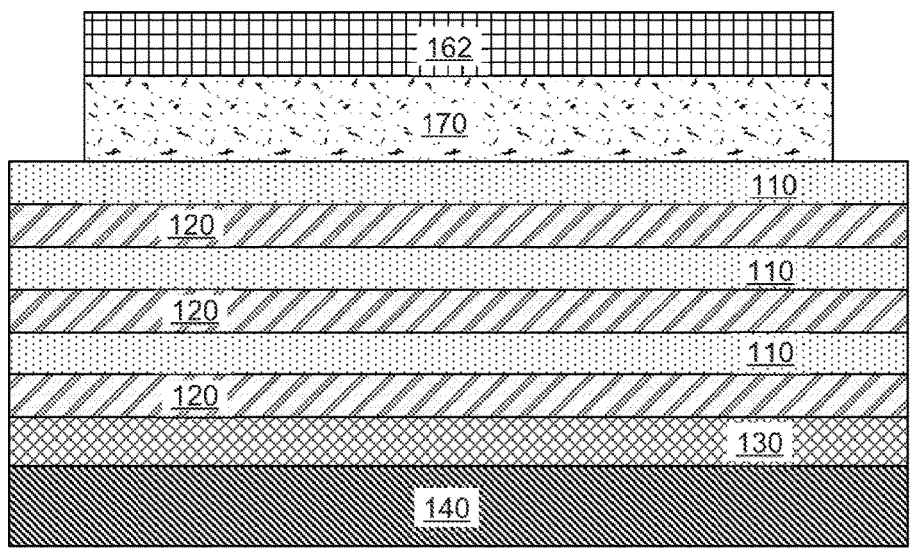

FIG. 8B illustrates an overhead view of the semiconductor structure of FIG. 8A. FIG. 8C illustrates a cross-sectional view of the semiconductor structure of FIG. 8B taken about the line II-II of FIG. 8B. As illustrated, FIG. 8A corresponds to a cross-sectional view of the semiconductor structure of FIG. 8B taken about the line of FIG. 8B. As shown in FIGS. 8B and 8C, dummy gate 170 and the layer of hard mask (HM) material 162 can be seen to only cover a portion of the semiconductor structure such that the endmost segments of STI oxide material 151 and 152, silicon channels 110, the layers of sacrificial SiGe material 120, the portion of SiGe material 130 are left exposed, i.e., not covered/protected by dummy gate 170 or hard mask (HM) material 162.

Figure 9:
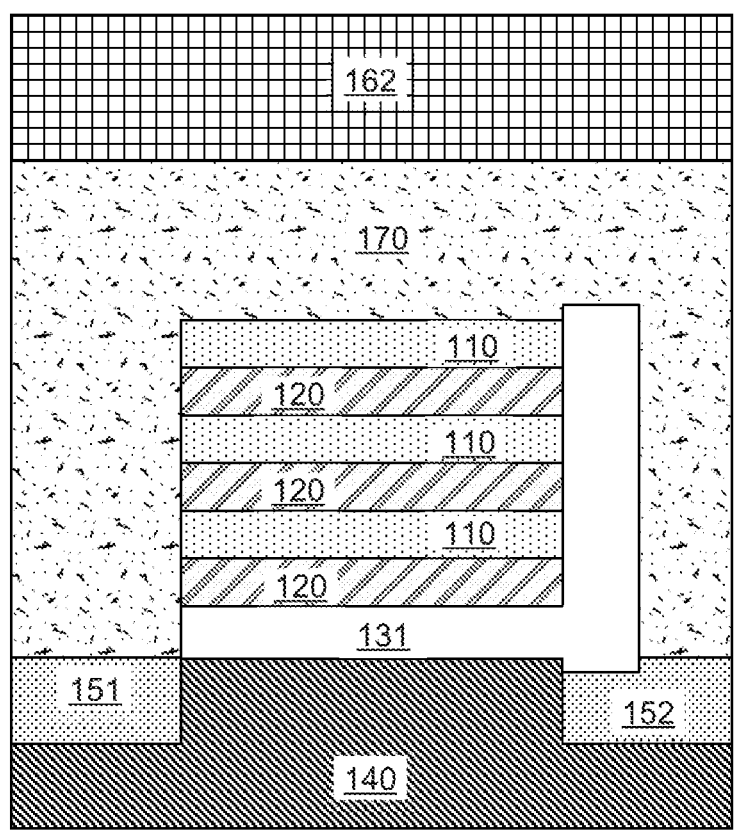
FIG. 9 illustrates a cross-sectional view of the semiconductor structure of FIG. 8B after an application of a selective etch process to remove the portion of SiGe material to form an opening.

FIG. 9 illustrates a cross-sectional view of the semiconductor structure of FIG. 8B after an application of a selective etch process to remove the portion of SiGe material 130, which forms opening 131. Note that the position of other structure/materials included in the semiconductor structure of FIG. 8B, excluding SiGe material 130, are maintained after the removal of SiGe material 130.

Figure 10A:
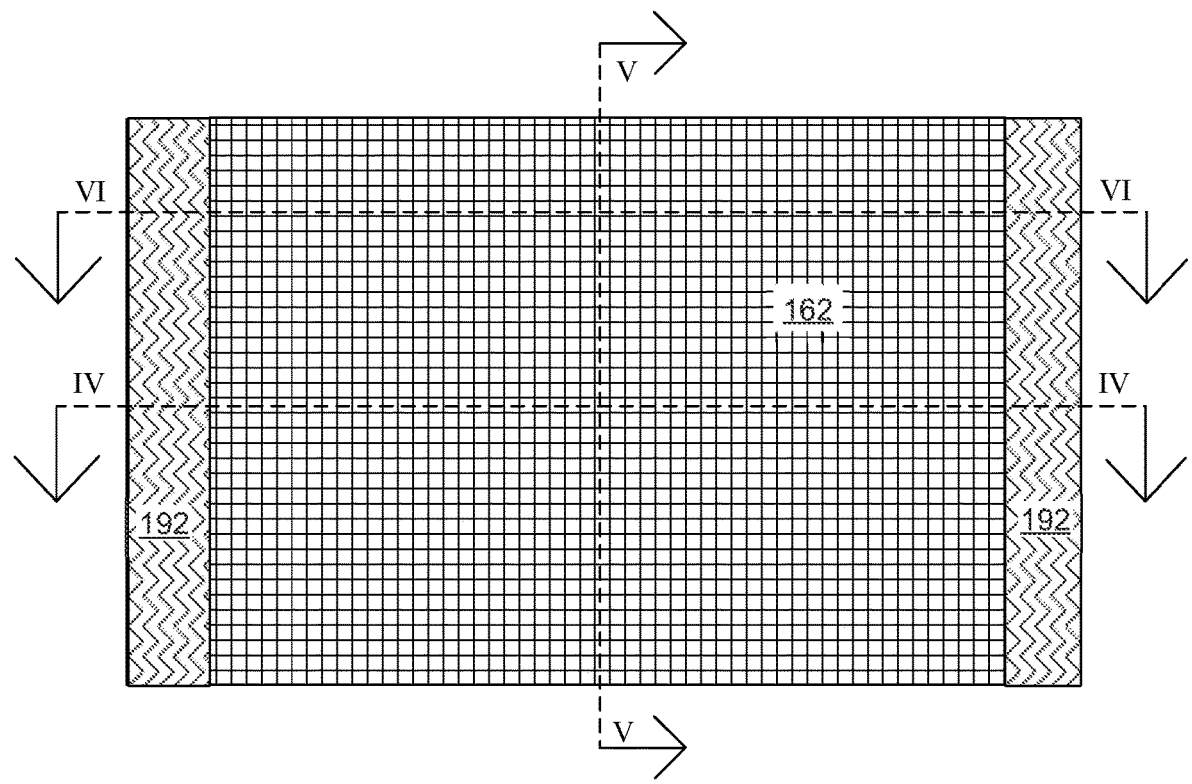
FIGS. 10A-10D illustrate views of the semiconductor structure of FIG. 9 after a deposition process is carried out that backfills the opening with a portion of spacer material.

FIG. 10A illustrates a top-down view of the semiconductor structure of FIG. 9 after a deposition process is carried out that backfills opening 131 with a portion of spacer material 192. In various embodiments, spacer material 192 may be composed of silicon nitride, SiBCN, SiOCN, SiON, or SiC, or combinations thereof. In one embodiment, spacer material 192 comprises silicon nitride (SiBCN). The formation of structures from such spacer materials are well understood by those skilled in the art and, as such, a more detailed description of such processes is not presented herein.

Figure 10B:
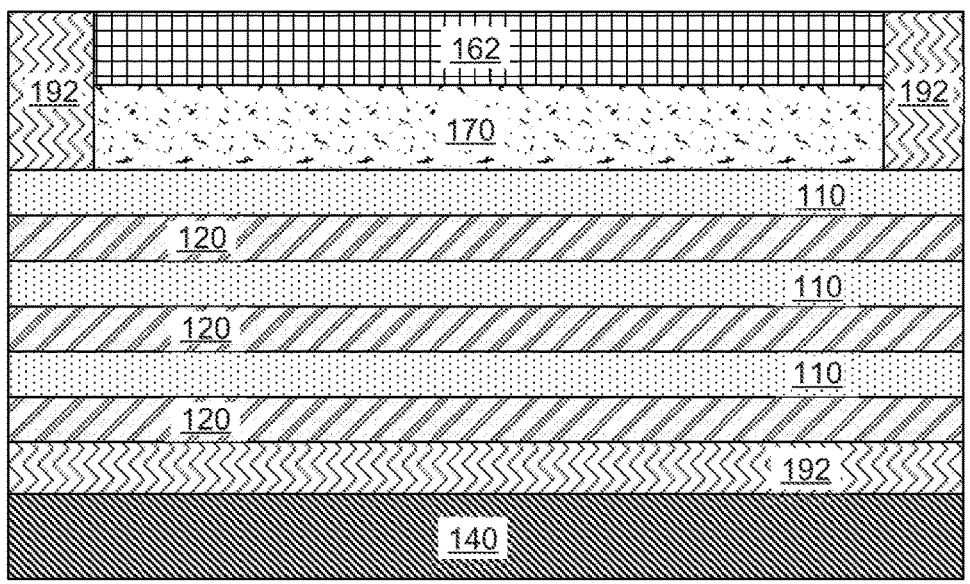

FIG. 10B illustrates a cross-sectional view of the semiconductor structure of FIG. 10A taken about the line IV-IV of FIG. 10A. Note that spacer material 192, dummy gate 170, and the layer of hard mask (HM) material 162 can be seen, in FIGS. 10B, 10C, and 10D, to only cover a portion of the semiconductor structure such that the ends of segments of STI oxide material 151 and 152, silicon channels 110, the layers of sacrificial SiGe material 120 are left exposed, i.e., not covered/protected by spacer material 192, dummy gate 170 or hard mask (HM) material 162.

Figure 10C:
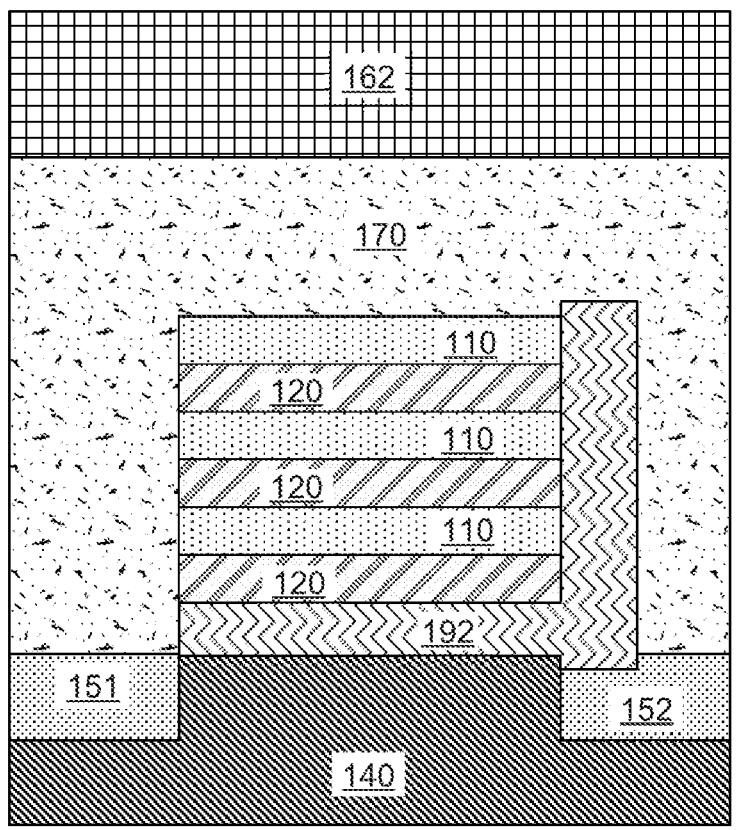

FIG. 10C is a cross-sectional view of the semiconductor structure of FIG. 10A taken about the line V-V of FIG. 10A.

Figure 10D:
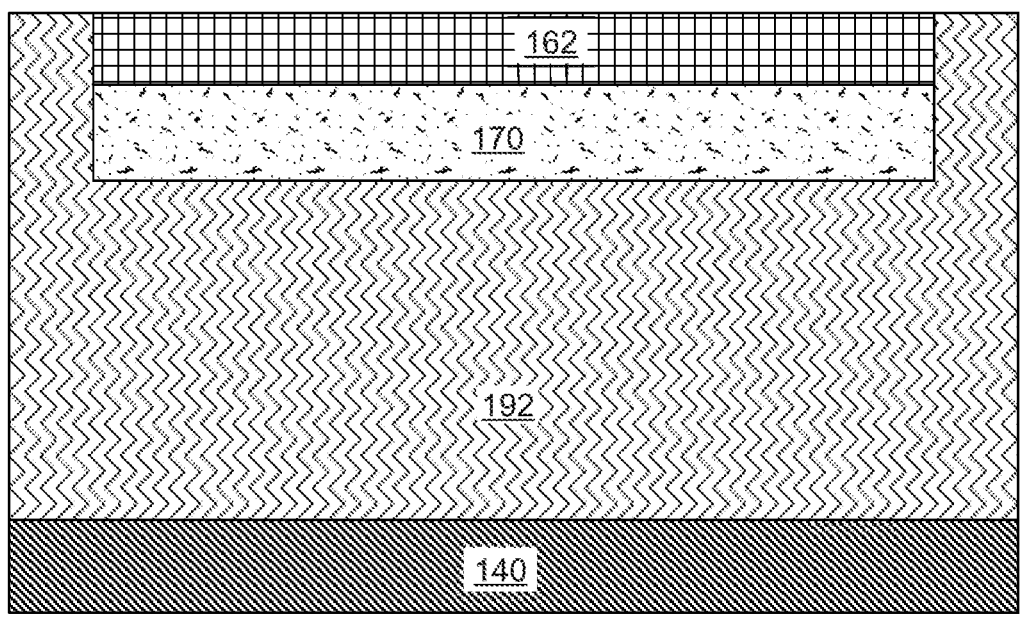

FIG. 10D is a cross-sectional view of the semiconductor structure of FIG. 10A taken about the line VI-VI of FIG. 10A. Note that line VI-VI of FIG. 10A passes through the vertical portion of spacer material 192 to more clearly show the flow of material.

Figure 11A:
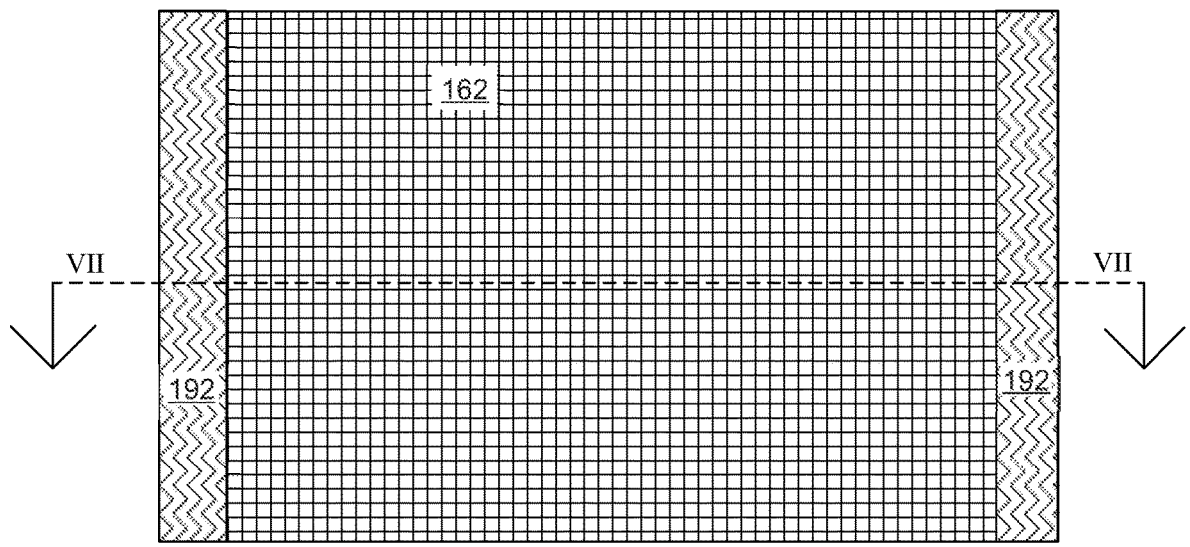
FIGS. 11A-11B illustrate views of the semiconductor structure of FIG. 10A after an etching process is carried out that etches out exposed end portions of sacrificial SiGe material to form openings.
Figure 11B:
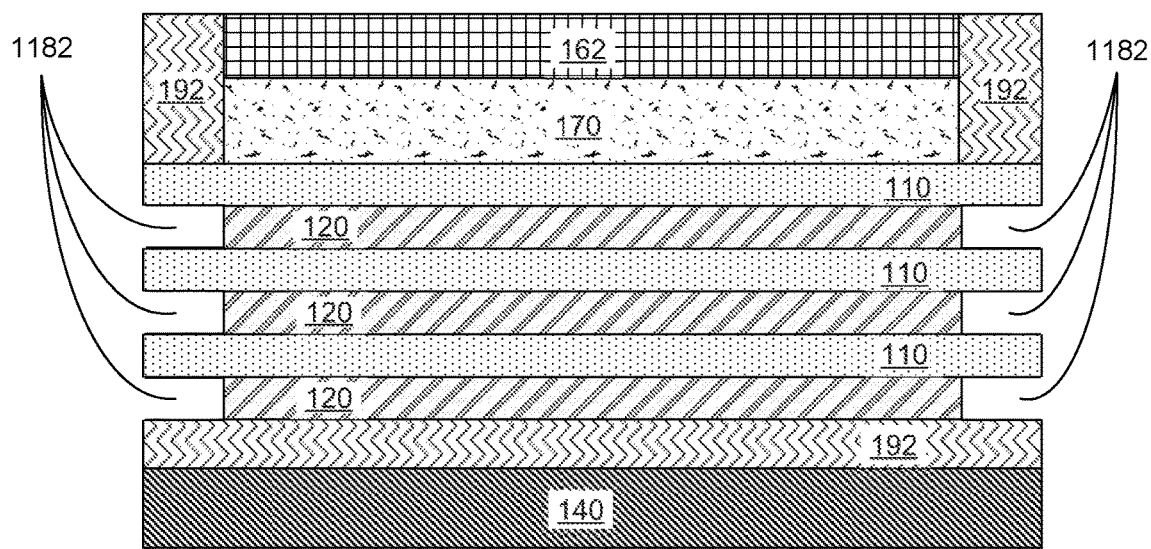

FIG. 11A illustrates a top-down view of the semiconductor structure of FIG. 10A after an etching process is carried out that etches out exposed end portions of sacrificial SiGe material 120 to form openings 1182, which are depicted in FIG. 11B. FIG. 11B is a cross-sectional view of the semiconductor structure of FIG. 11A taken about the line VII-VII of FIG. 11A. In this embodiment, the end portions of sacrificial SiGe material 120 are etched back, to create openings between the layers of silicon channels 110, while leaving the layers of silicon channels 110 relatively unchanged.

Figure 12A:
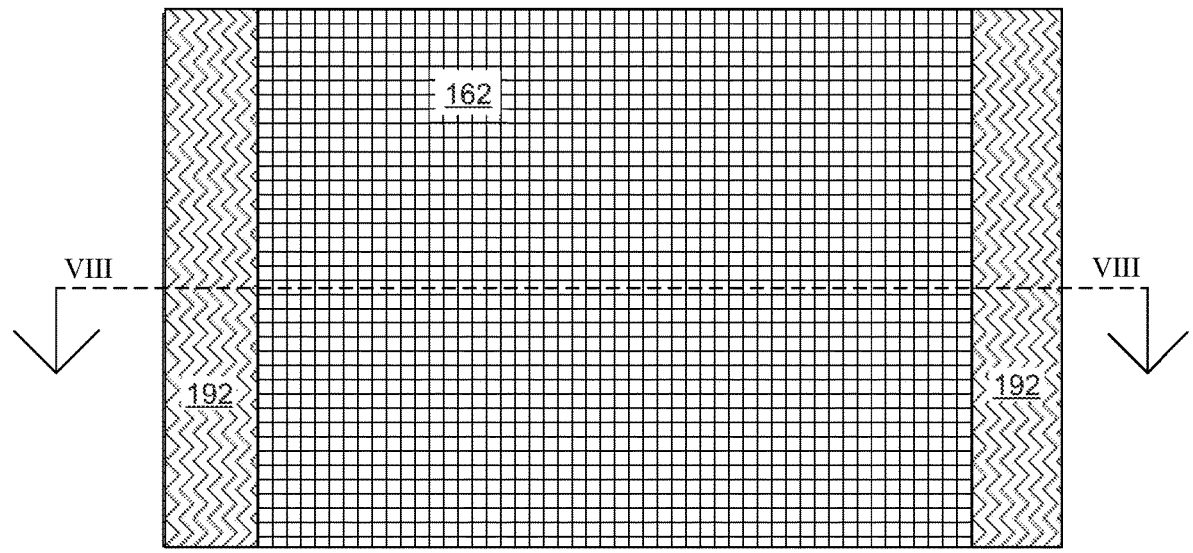
FIGS. 12A-12B illustrate views of the semiconductor structure of FIG. 11A after a deposition process is carried out that backfills openings with a portion of spacer material.
Figure 12B:
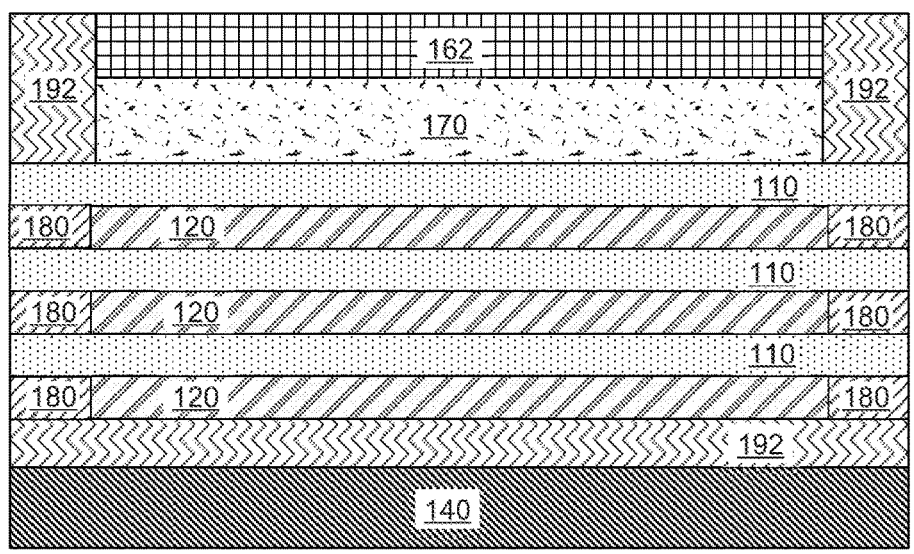

FIG. 12A illustrates a top-down view of the semiconductor structure of FIG. 11A after a deposition process is carried out that backfills openings 1182 with a portion of spacer material. FIG. 12B is a cross-sectional view of the semiconductor structure of FIG. 12A taken about the line VIII-VIII of FIG. 12A and more clearly shows the locations of spacers 180. The openings 1182, between the layers of silicon channels 110, are then backfilled with spacer material and excess spacer material is removed resulting in the formation of spacers 180. In this embodiment, spacers 180 are composed of SiN or SIBCN.

Figure 13A:
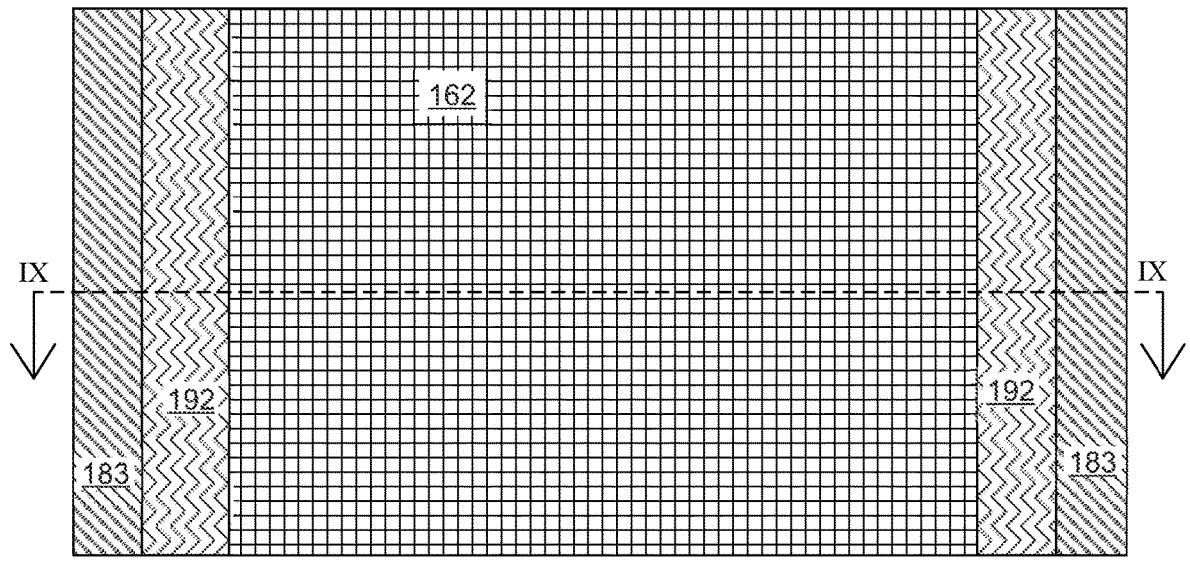
FIGS. 13A-13B illustrate views of the semiconductor structure of FIG. 12A after the formation of portions of inter-layer dielectric (ILD) material on portions of doped silicon.
Figure 13B:
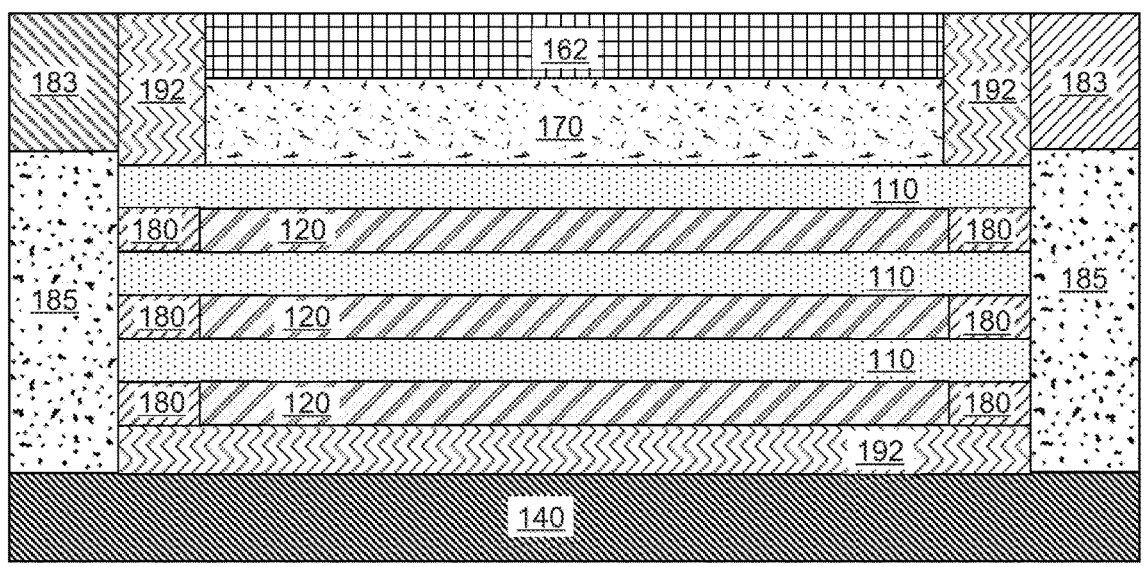

FIG. 13A illustrates a top-down view of the semiconductor structure of FIG. 12A after the formation of portions of inter-layer dielectric (ILD) material, 183, on portions of doped silicon, 185. FIG. 13B is a cross-sectional view of the semiconductor structure of FIG. 13A taken about the line IX-IX of FIG. 13A and more clearly shows the locations of the portions of ILD material 183 and the portions of doped silicon 185.

In one embodiment, ILD material 183 is composed of a flowable oxide material, e.g., silicon oxide. In general, the portions of ILD material 183 form isolation layers respectively surrounding the portions of doped silicon 185, i.e., the source/drain regions. The portions of ILD material 183 may be formed using a dielectric material including inorganic dielectrics or organic dielectrics, and is either porous or non-porous, or a combination thereof. Examples of suitable dielectrics include, but are not limited to, SiC, Si3N4, SiO2, a carbon doped oxide, SiC(N,H), a low-K dielectric, or multilayers thereof.

In one embodiment, the portions of doped silicon 185 are composed of Silicon-Germanium doped with Boron (SiGe:B). In one embodiment, such portions of SiGe:B are formed using epitaxial growth of SiGe:B for pFET source/drain areas. In another embodiment, the portions of doped silicon 185 are composed of Silicon doped with phosphorus (Si:P) for nFET source/drain areas.

Figure 14A:
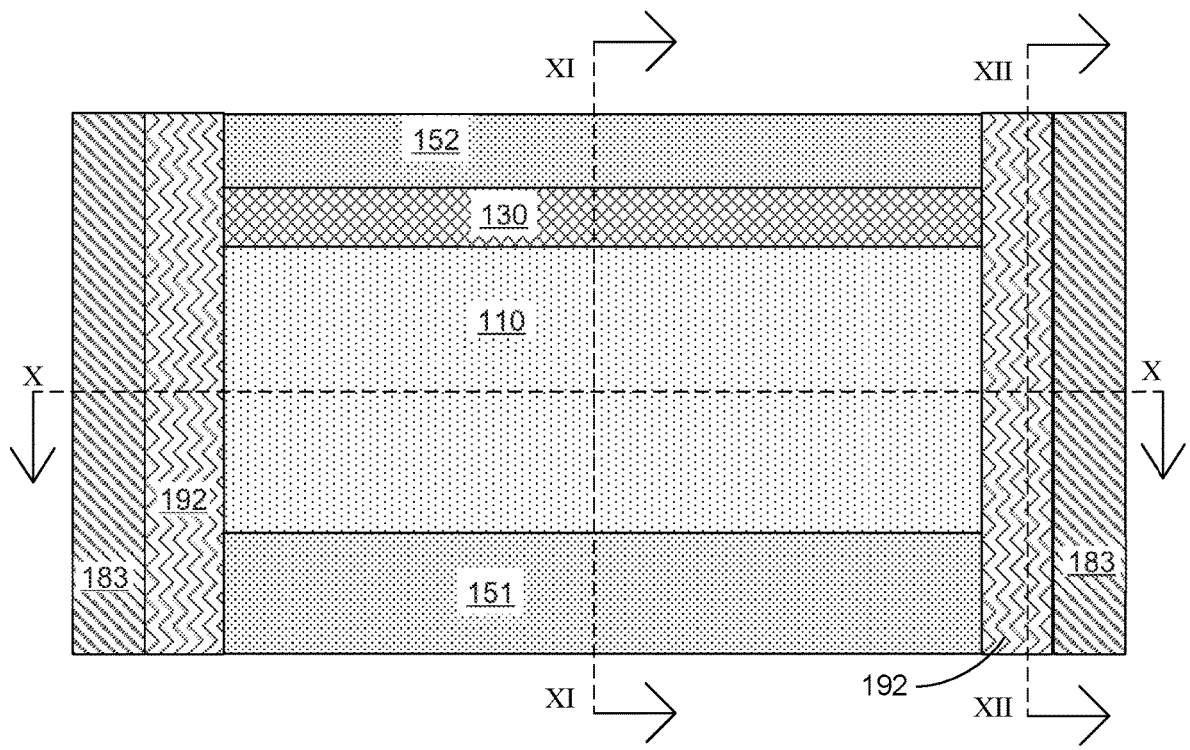
FIGS. 14A-14D illustrate views of the semiconductor structure of FIG. 13A after the removal of HM material and dummy gate.
Figure 14B:
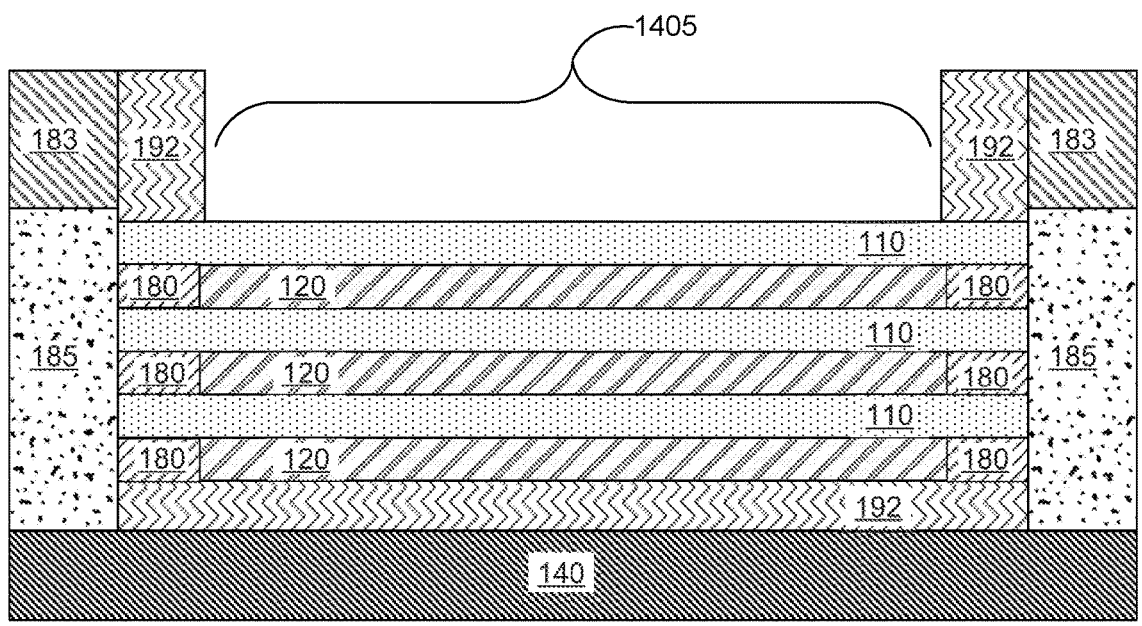
Figure 14C:
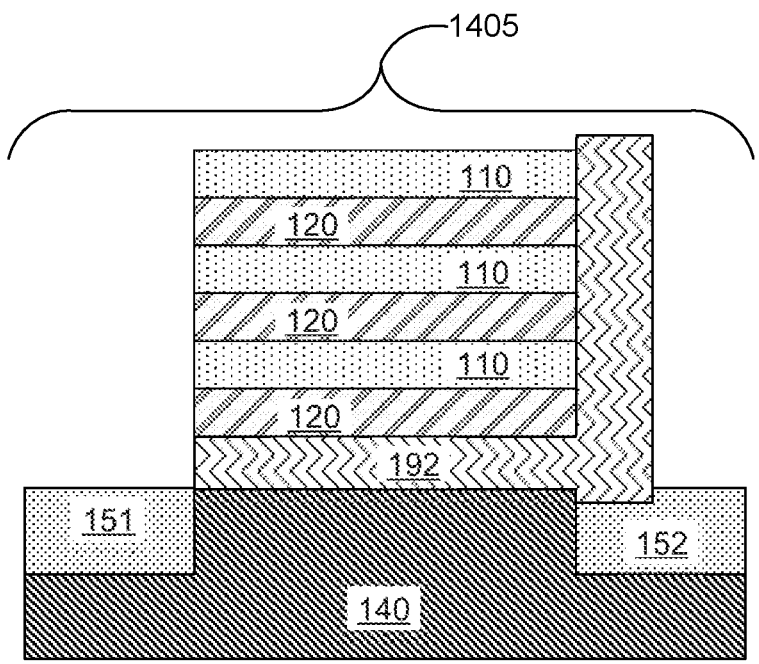
Figure 14D:
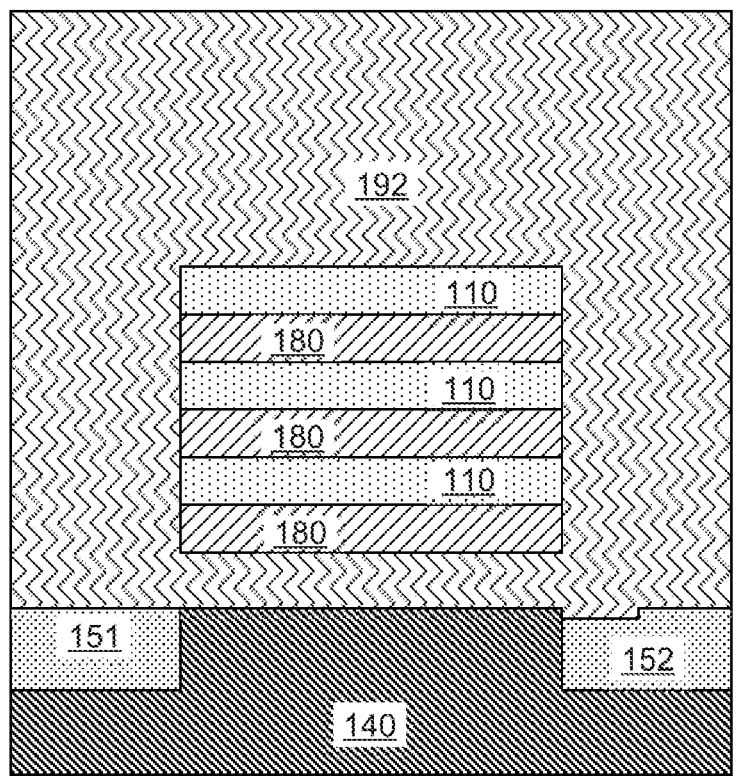

FIG. 14A illustrates a top-down view of the semiconductor structure of FIG. 13A after the removal of HM material 162 and dummy gate 170. In one embodiment, dummy gate removal is achieved via etching amorphous Si (dummy gate material) with ammonia. FIG. 14B is a cross-sectional view of the semiconductor structure of FIG. 14A taken about the line X-X of FIG. 14A and more clearly shows the locations of the opening, indicated by bracket 1405, that is created by the removal of HM material 162 and dummy gate 170. FIG. 14C is a cross-sectional view of the semiconductor structure of FIG. 14A taken about the line XI-XI of FIG. 14A and more clearly shows the opening, indicated by bracket 1405, that is created by the removal of HM material 162 and dummy gate 170. FIG. 14D is a cross-sectional view of the semiconductor structure of FIG. 14A taken about the line XII-XII of FIG. 14A and more clearly shows that the portion of spacer material 192 remains and is covering the ends of silicon channels 110 and spacers 180.

Figure 15A:
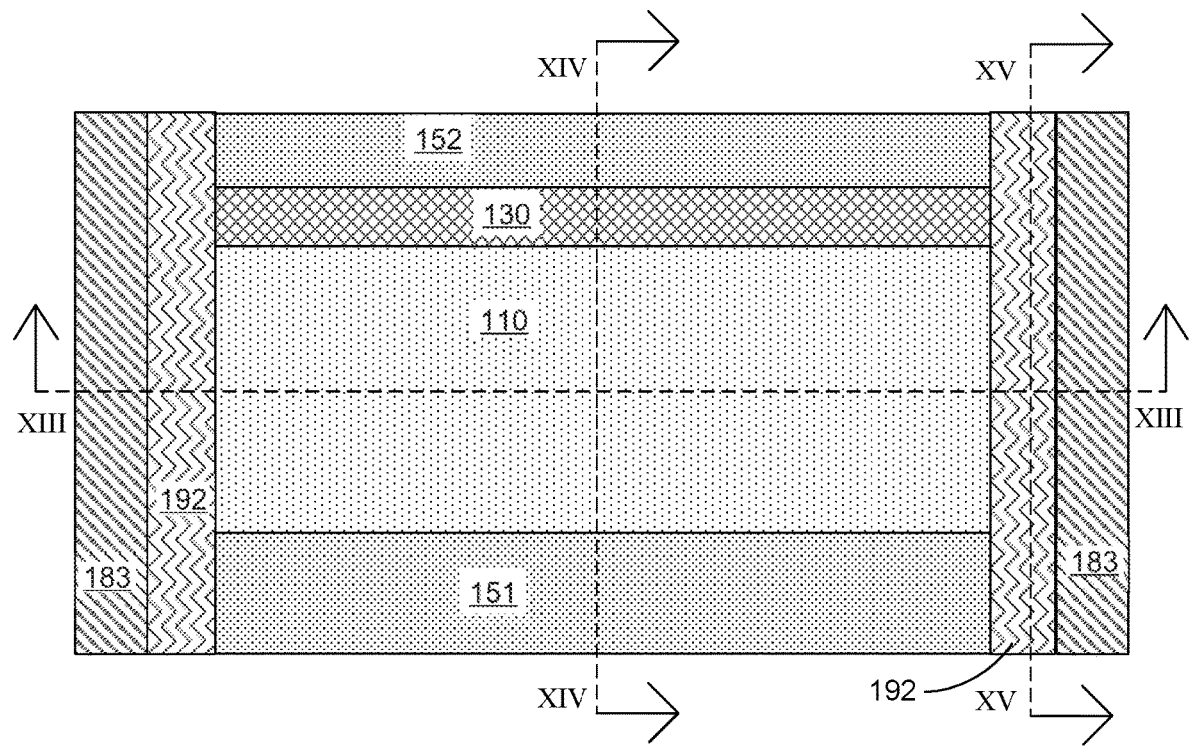
FIGS. 15A-15D illustrate views of the semiconductor structure of FIG. 14A after the removal of the remaining portions of sacrificial SiGe material.
Figure 15B:
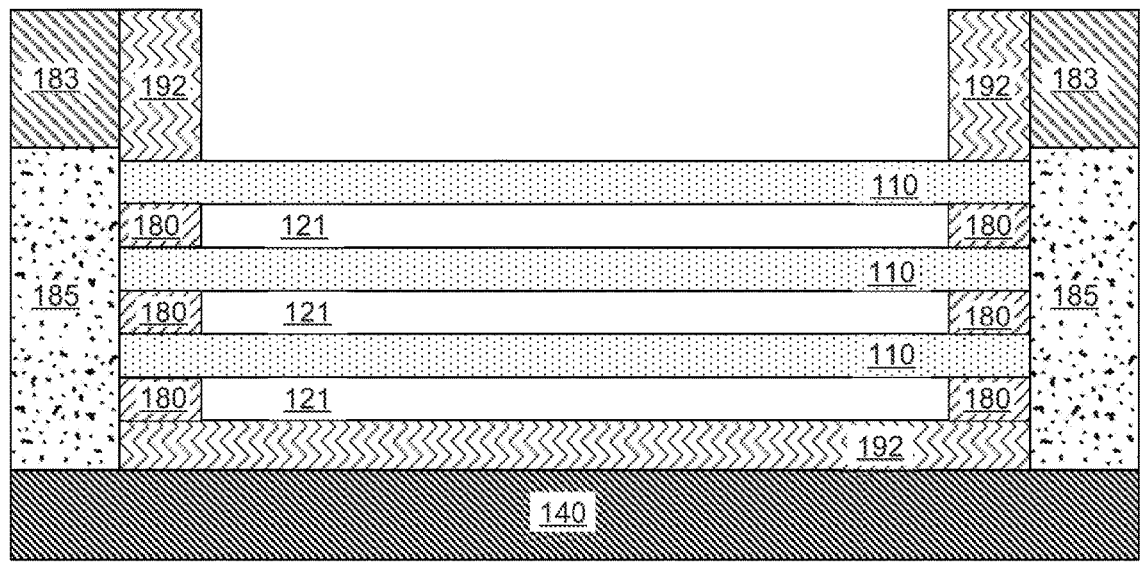
Figure 15C:
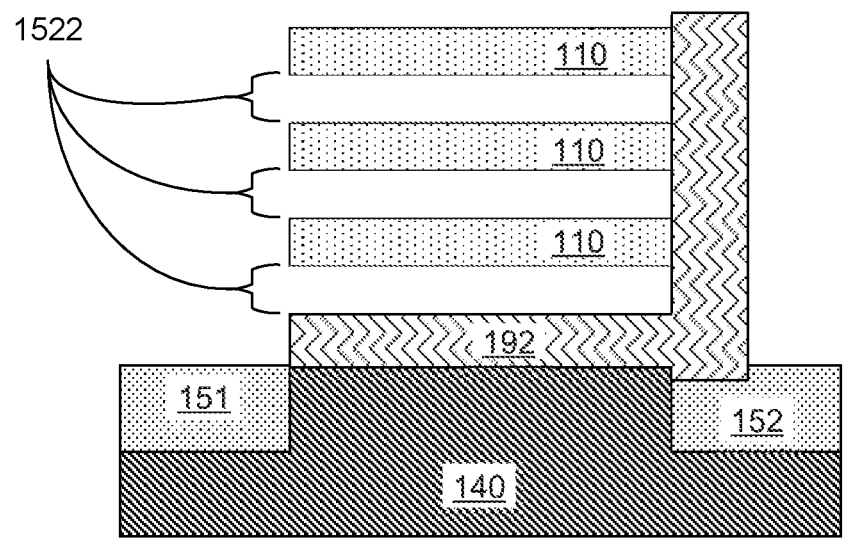
Figure 15D:
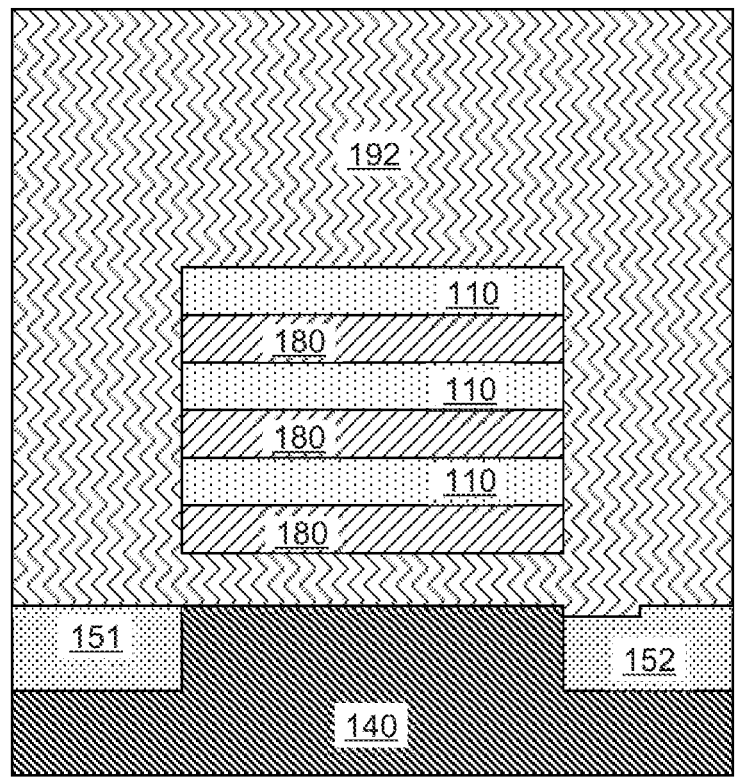

FIG. 15A illustrates a top-down view of the semiconductor structure of FIG. 14A after the removal of the remaining portions of sacrificial SiGe material 120. In one embodiment, removal of the remaining portions of sacrificial SiGe material 120 is accomplished using an isotropic etch of the SiGe material, e.g., using HCl gas or wet etch (HCl). FIG. 15B is a cross-sectional view of the semiconductor structure of FIG. 15A taken about the line XIII-XIII of FIG. 15A and more clearly shows the locations of the openings, 121, that are created by the removal of sacrificial SiGe material 120. FIG. 15C is a cross-sectional view of the semiconductor structure of FIG. 15A taken about the line XIV-XIV of FIG. 15A and more clearly shows the locations of the openings 121, which are indicated by brackets, 1522, in FIG. 15C, that are created by the removal of sacrificial SiGe material 120 and that support for the more central regions of silicon channels 110 is still provided by the vertical portion/extension of SiGe material 130. FIG. 15D is a cross-sectional view of the semiconductor structure of FIG. 15A taken about the line XV-XV of FIG. 15A and more clearly shows that support for the ends of silicon channels 110 is still provided by spacers 180 and the bottom portion of SiGe material 130.

Figure 16A:
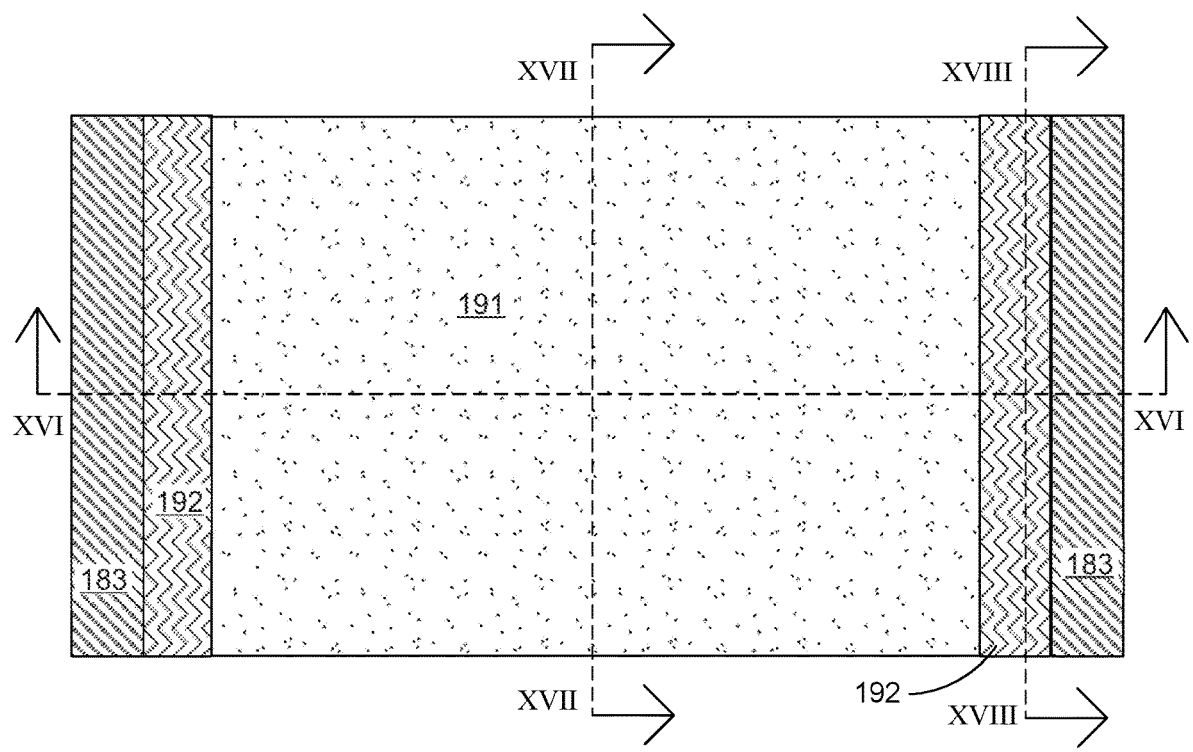
FIGS. 16A-16D illustrate views of the semiconductor structure of FIG. 15A after a deposition process is carried out that backfills the openings to form a gate structure.

FIG. 16A illustrates a top-down view of the semiconductor structure of FIG. 15A after a deposition process is carried out that backfills the openings 121 and the area indicated by (i) bracket 1405 in FIGS. 14B and 14C, (ii) by brackets, 1522, in FIG. 15C, and (iii) as openings 121 in FIG. 15B. In this embodiment, the backfill process fills these areas with gate material 191, including an initial layer of high-k dielectric, such as hafnium (IV) oxide ($HfO_2$), followed by a bulk metallic gate material, such as TiN. The formation of high-k dielectric material may further include forming a subsequent layer of work-function material (WFM) on top of the high-k dielectric material.

In one embodiment, gate material 191 includes multiple layers of material including a combination of materials selected from the following material types: an interface material, a high-k dielectric material, a diffusion barrier material, a work-function adjusting material, a capping material, and a bulk gate material. In this embodiment, the bulk gate material is composed of TiN, but embodiments are not limited thereto. In general, the layers of material of gate material 191 comprise an electrically conductive material/structure that is readily understood by one having ordinary skill in the art to constitute a gate for a FinFET type device, which, in this embodiment, is for a horizontally stacked gate-all-around (GAA) nanosheet structure.

In one embodiment, the high-K dielectric is nitrided hafnium silicates (HfSiON). Other examples of high-k dielectrics include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

Figure 16B:
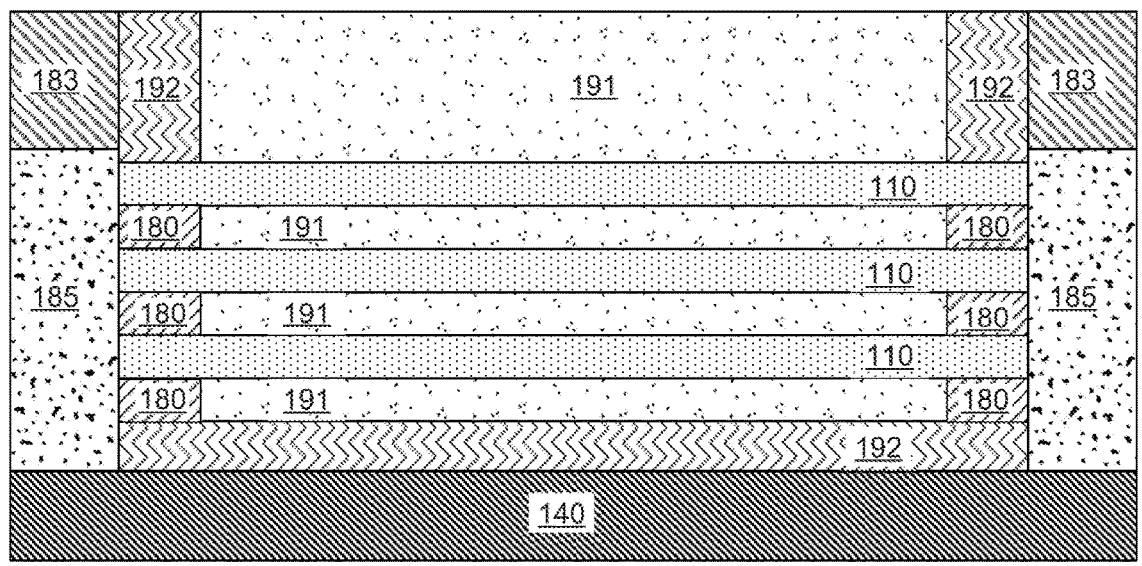
Figure 16C:
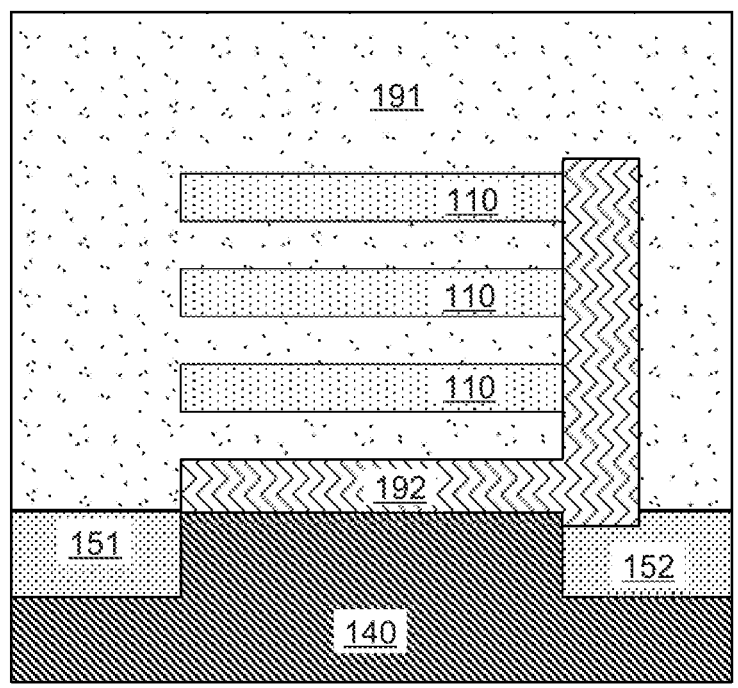
Figure 16D:
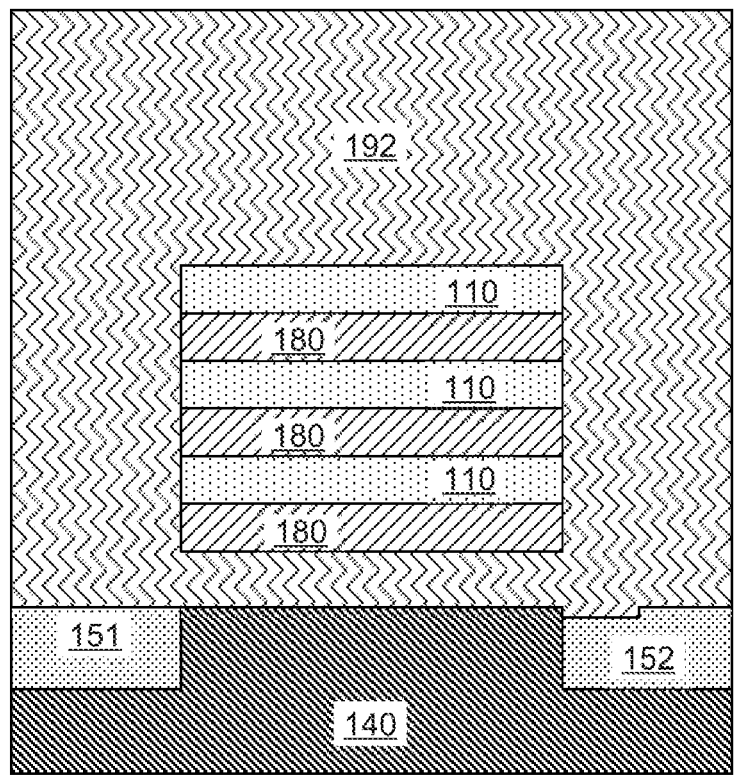

FIGS. 16B and 16C are cross-sectional views of the semiconductor structure of FIG. 16A respectively taken about the lines XVI-XVI and XVII-XVII of FIG. 16A and more clearly shows the complete filling of openings 121 and the area indicated by (i) bracket 1405 in FIGS. 14B and 14C, (ii) by brackets, 1522, in FIG. 15C, and (iii) as openings 121 in FIG. 15B. As such, gate material 191 can be seen to form a type of gate-all-around structure around silicon channels 110. FIG. 16D is a cross-sectional view of the semiconductor structure of FIG. 16A taken about the line XVIII-XVIII of FIG. 16A and more clearly shows that support for the ends of silicon channels 110 is still provided by spacers 180 and the bottom portion of SiGe material 130.

Figure 17A:
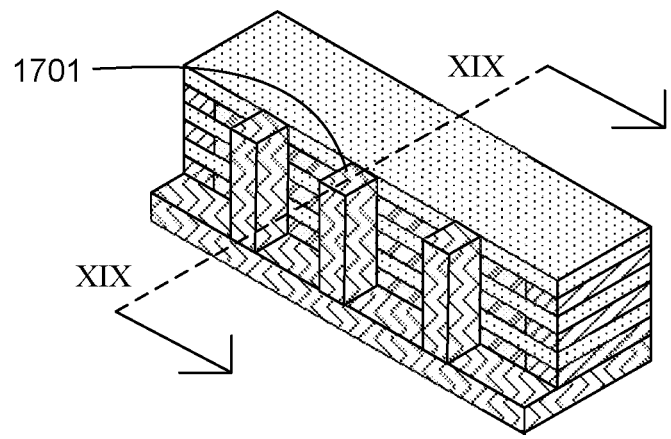
FIGS. 17A-17B illustrate views of select elements of a semiconductor structure of an alternate embodiment in which the vertical portion of SiGe material comprises an external pillar type of support structure.

FIG. 17A is a perspective view of select elements of a semiconductor structure of an alternate embodiment in which the vertical portion of SiGe material 130 comprises an external pillar type of support structure, denoted pillar 1701. As can be seen in FIG. 17A, a given embodiment may include one or more such pillars (the depicted embodiment includes three such pillars). One having ordinary skill in the art recognizes that, in view of the disclosed processes, minor modifications to the processes discussed with reference to FIGS. 2, 3, and 4 are readily available to produce the semiconductor structure of FIGS. 17A and 17B. For example, HM material 161 can be extended out over STI oxide material 152 and holes created such that the etching process of FIG. 3 yields one or more pillar shaped channels, which can then be filled with SiGe material 130 to yield pillar 1701. One such embodiment employs the tri-layer mask stack to control the placement and size of such pillars.

Figure 17B:
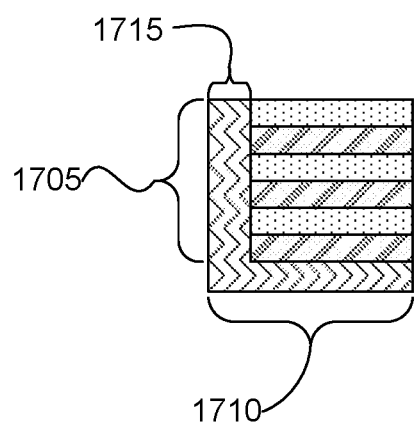

FIG. 17B illustrates a cross-sectional view of semiconductor structure of FIG. 17A taken about the line XIX-XIX of FIG. 17A. As shown in FIG. 17B a structure is provided that still brackets the alternating layers of silicon channels 110 and layers of sacrificial SiGe material 120, and has (a) a base portion with a width, denoted by bracket 1710, and (b) a vertical portion with (i) a height denoted by bracket 1705, and (ii) a width denoted by bracket 1715. In this embodiment, as can be understood in light of FIGS. 17A and 17B and their associated description, the vertical portion of this support bracket constitutes at least one vertical portion of material with a height, denoted by bracket 1705, that is substantially greater than the width of that vertical portion, denoted by bracket 1715. Similar to the embodiment depicted in FIGS. 7A and 7B, pillar 1701 can be seen to provide support for silicon channels 110 in accordance with certain processing steps described herein.

Figure 18A:
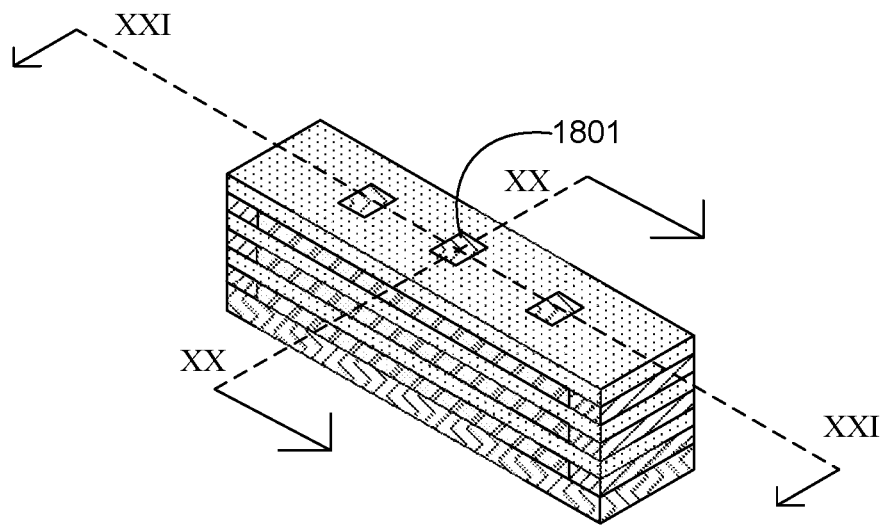
FIGS. 18A-18E illustrate views of select elements of a semiconductor structure of an alternate embodiment in which the vertical portion of SiGe material comprises an enclosed, i.e., internal, pillar type of support structure.

FIG. 18A is a perspective view of select elements of a semiconductor structure of an alternate embodiment in which the vertical portion of spacer material 192 comprises an enclosed, i.e., internal, pillar type of support structure, denoted pillar 1801. As can be seen in FIG. 18A, a given embodiment may include one or more such pillars (the depicted embodiment includes three such pillars) that are located inside of silicon channels 110, i.e., not adjacent to silicon channels 110.

Figure 18B:
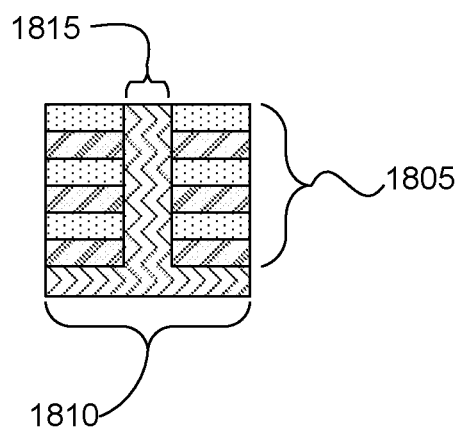

FIG. 18B illustrates a cross-sectional view of semiconductor structure of FIG. 18A taken about the line XX-XX of FIG. 18A. As shown in FIG. 18B a structure is provided that still supports the alternating layers of silicon channels 110 and layers of sacrificial SiGe material 120, and has (a) a base portion with a width, denoted by bracket 1810, and (b) a vertical portion with (i) a height denoted by bracket 1805, and (ii) a width denoted by bracket 1815. In this embodiment, as can be understood in light of FIGS. 18A and 18B and their associated description, the vertical portion of this support bracket constitutes at least one vertical portion of material with a height, denoted by bracket 1805, that is substantially greater than the width of that vertical portion, denoted by bracket 1815. Similar to the embodiment depicted in FIGS. 17A and 17B, pillar 1801 can be seen to provide support for silicon channels 110 in accordance with certain processing steps described herein.

Figure 18C:
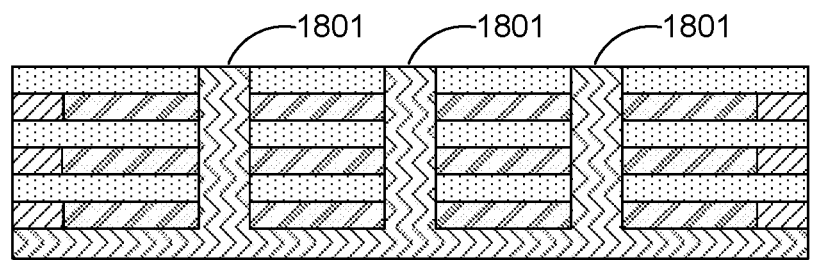

FIG. 18C illustrates a cross-sectional view of semiconductor structure of FIG. 18A taken about the line XXI-XXI of FIG. 18A. As shown in FIG. 18C a structure is provided that includes three internal pillars. It is noted that while inclusion of such internal pillars may result in a decrease in the amount of silicon included in silicon channels 110, the resulting footprint of such a structure would be the same as that of a structure that did not include any support structure for silicon channels 110. As such, inclusion of such support structures has little to no impact on the density of such structures in an integrated circuit.

In a process following those of FIGS. 2, 3, and 4, FIG. 18D depicts an etching process for the formation of a vertical opening, denoted by bracket 1815, with a height/length that extends down to and exposes a central area of the portion of SiGe material 130, in accordance with one embodiment. In some embodiments, the vertical opening, denoted by bracket 1815, has a width 8-15 nm. However, the width of the vertical opening denoted by bracket 1815 may be greater than 15 nm or less than 8 nm in accordance with an embodiment. One such embodiment employs the tri-layer mask stack to control the placement and size of such vertical openings.

Figure 18D:
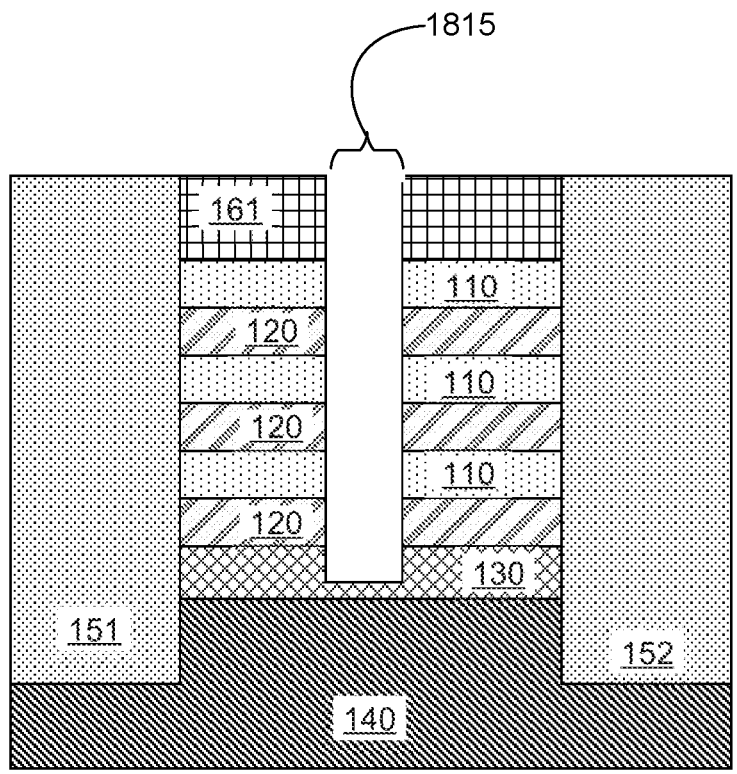
Figure 18E:
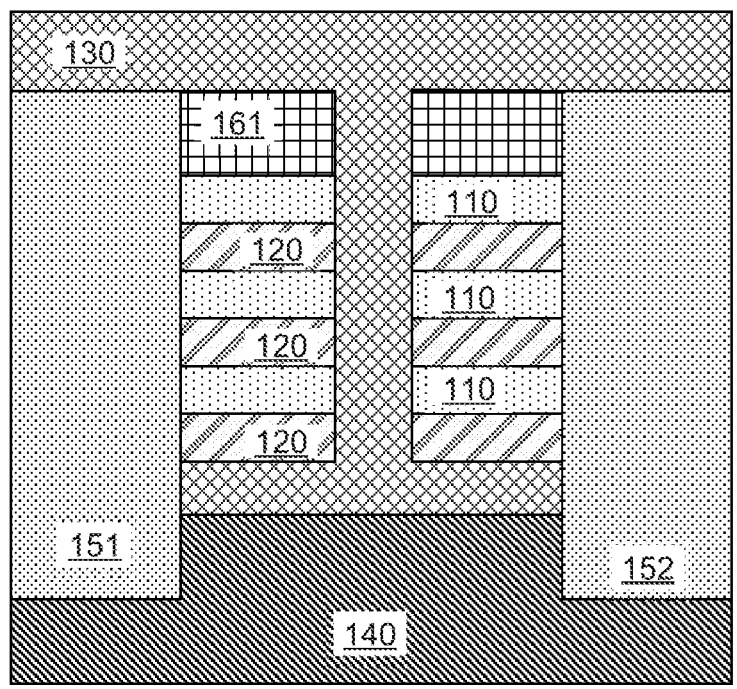

FIG. 18E illustrates a cross-sectional view of a semiconductor structure that results from a conformal filling of vertical opening, denoted by bracket 1815, of the semiconductor structure of FIG. 18D, with additional 65% Silicon-Germanium to form a vertical extension of the portion of SiGe material 130. Note that the vertical extension abuts and bonds to the sides of silicon channels 110 on all sides of the pillar. Embodiment recognize that such an increase in bonded surface area may inhibit unintended detachment of the pillar from silicon channels 110.

In one embodiment, a method of forming a semiconductor device is provided, the method comprising: forming a layer of support material; forming a stack of nano-sheets over the layer of support material; and forming a vertical support with (i) a bottom that is affixed to layer of support material and (ii) a side that is affixed to at least one nano-sheet of the stack of nano-sheets. In one embodiment, the method further comprises: forming a gate structure that covers at least a central portion of the stack of nano-sheets. In one embodiment, the method further comprises: forming a first source/drain structure affixed to a first end of the stack of nano-sheets; and forming a second source/drain structure affixed to a second end of the stack of nano-sheets.

In one embodiment, the vertical support is affixed to the stack of nano-sheets at a position along the length of the stack of nano-sheets that is between the first source/drain structure and the second source/drain structure. In one embodiment, the first source/drain structure, second source/drain structure, stack of nano-sheets, and gate structure comprise a nano-sheet field-effect transistor that is either an n-FET or a p-FET. In one embodiment, the gate structure is located between the first source/drain structure and the second source/drain structure. In one embodiment, (i) the vertical support is affixed to a side of at least one nano-sheet of the stack of nano-sheets and (ii) the side extends from first source/drain structure to the second source/drain structure. In one embodiment, the vertical support includes one or more vertical pillar structures that are affixed to at least one nano-sheet of the stack of nano-sheets. In one embodiment, the one or more vertical pillar structures are affixed to an external side of the at least one nano-sheet of the stack of nano-sheets. In one embodiment, the vertical support includes one or more vertical pillar structures that penetrate at least one nano-sheet of the stack of nano-sheets such that a side of the pillar is affixed to an internal side of the least one nano-sheet.

In one embodiment a semiconductor structure is provided, the semiconductor structure comprising: a nano-sheet field-effect transistor; a layer of support material that is located beneath a stack of nano-sheets that are included in the nano-sheet field-effect transistor; and a vertical support that is affixed to a stack of nano-sheets, wherein the vertical support (i) has an end that is affixed to the layer of support material and (ii) a side that is a affixed to at least one nano-sheet of the stack of nano-sheets. In one embodiment the semiconductor structure further comprises: a first source/drain structure affixed to a first end of the stack of nano-sheets; and a second source/drain structure affixed to a second end of the stack of nano-sheets. In one embodiment, the semiconductor structure further comprises: gate structure that covers at least a central portion of the stack of nano-sheets. In one embodiment the nano-sheet field-effect transistor is either the n-FET or the p-FET.

In one embodiment the vertical support is affixed to the stack of nano-sheets at a position along the length of the stack of nano-sheets that is between the first source/drain structure and the second source/drain structure. In one embodiment the gate structure is located between the first source/drain structure and the second source/drain structure. In one embodiment (i) the vertical support is affixed to a side of at least one nano-sheet of the stack of nano-sheets and (ii) the side extends from first source/drain structure to the second source/drain structure. In one embodiment the vertical support includes one or more vertical pillar structures that are affixed to at least one nano-sheet of the stack of nano-sheets. In one embodiment the one or more vertical pillar structures are affixed to an external side of the at least one nano-sheet of the stack of nano-sheets. In one embodiment the vertical support includes one or more vertical pillar structures that penetrate at least one nano-sheet of the stack of nano-sheets such that a side of the pillar is affixed to an internal side of the least one nano-sheet.

While certain combinations of vertical supports are disclosed herein, embodiments are not limited thereto. Embodiments recognize that certain externally located vertical supports may only provide support to one side of silicon channels 110. As such, some embodiments include a combination of vertical support one side, both sides and/or centrally located to provide more consistent support for silicon channels 110. For example, in one embodiment, pillars are located across from each other on both sides of silicon channels 110. In another example and embodiment, such pillars are in a staggered formation on both sides of silicon channels 110. In another example and embodiment, the vertical "wall" type structure supports one side while two pillars support the other side of silicon channels 110. In a last example and embodiment, a single support pillar is placed in the middle of silicon channels 110 while four external pillars support the other outer sides of silicon channels 110 in a pattern of two external pillars, 1 internal pillar, two external pillars. One having ordinary skill in the art readily recognizes the wide number of variations encompassed by the embodiments of this disclosure.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as, for instance, "side", "over", "perpendicular", "tilted", etc., as used herein refer to relative location and orientation of various portions of the structures with respect to one another, and are not intended to suggest that any particular absolute orientation with respect to external objects is necessary or required.

The foregoing specification also describes processing steps. While some of the steps may be in an ordered sequence, others may in different embodiments from the order that they were detailed in the foregoing specification. The ordering of steps when it occurs is explicitly expressed, for instance, by such adjectives as, "ordered", "before", "after", "following", and others with similar meaning.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art.

What is claimed is:

1. A method of forming a semiconductor device, the method comprising:
   forming a layer of support material;
   forming a stack of nano-sheets over the layer of support material; and
   forming a vertical support with (i) a bottom that is affixed to the layer of support material and (ii) a side that is affixed to at least one nano-sheet of the stack of nano-sheets, wherein the vertical support includes one or more vertical pillar structures that are affixed to at least one nano-sheet of the stack of nano-sheets, and wherein the one or more vertical pillar structures are affixed to an external side of the at least one nano-sheet of the stack of nano-sheets.

2. The method of claim 1, the method further comprising:
   forming a first source/drain structure affixed to a first end of the stack of nano-sheets; and
   forming a second source/drain structure affixed to a second end of the stack of nano- sheets.

3. The method of claim 2, wherein the vertical support is affixed to the stack of nano-sheets at a position along a length of the stack of nano-sheets that is between the first source/drain structure and the second source/drain structure.

4. The method of claim 2, the method further comprising:
   forming a gate structure that covers at least a central portion of the stack of nano-sheets.

5. The method of claim 4, wherein the first source/drain structure, the second source/drain structure, the stack of nano-sheets, and the gate structure comprise a nano-sheet field-effect transistor that is either an n-FET or a p-FET.

6. The method of claim 4, wherein the gate structure is located between the first source/drain structure and the second source/drain structure.

7. The method of claim 2, wherein (i) the vertical support is affixed to a side of at least one nano-sheet of the stack of nano-sheets and wherein (ii) the side of the vertical support, which is affixed to the at least one nano-sheet, extends from the first source/drain structure to the second source/drain structure.

8. The method of claim 1, wherein the vertical support includes one or more vertical pillar structures that penetrate the at least one nano-sheet of the stack of nano-sheets such that a side of the pillar is affixed to an internal side of the least one nano-sheet.

9. A semiconductor structure, the semiconductor structure comprising:
   a nano-sheet field-effect transistor;

a layer of support material that is located beneath a stack of nano-sheets that are included in the nano-sheet field-effect transistor; and a vertical support that is affixed to a stack of nano-sheets, wherein the vertical support (i) has an end that is affixed to the layer of support material and (ii) a side that is affixed to at least one nano-sheet of the stack of nano-sheets, wherein the vertical support includes one or more vertical pillar structures that are affixed to at least one nano-sheet of the stack of nano-sheets, and wherein the one or more vertical pillar structures are affixed to an external side of the at least one nano-sheet of the stack of nano-sheets.

10. The semiconductor structure of claim 9, the semiconductor structure further comprising:

a gate structure that covers at least a central portion of the stack of nano-sheets.

11. The semiconductor structure of claim 10, the semiconductor structure further comprising:

a first source/drain structure affixed to a first end of the stack of nano-sheets; and a second source/drain structure affixed to a second end of the stack of nano-sheets.

12. The semiconductor structure of claim 11, wherein the vertical support is affixed to the stack of nano-sheets at a position along a length of the stack of nano-sheets that is between the first source/drain structure and the second source/drain structure.

13. The semiconductor structure of claim 11, wherein the gate structure is located between the first source/drain structure and the second source/drain structure.

14. The semiconductor structure of claim 10, wherein (i) the vertical support is affixed to a side of at least one nano-sheet of the stack of nano-sheets and (ii) the side of the vertical support, which is affixed to the at least one nano-sheet, extends from the first source/drain structure to the second source/drain structure.

15. The semiconductor structure of claim 9, wherein the nano-sheet field-effect transistor is either an n-FET or a p-FET.

16. The semiconductor structure of claim 9, wherein the vertical support includes one or more vertical pillar structures that penetrate the at least one nano-sheet of the stack of nano-sheets such that a side of the one or more vertical pillar structures is affixed to an internal side of the least one nano-sheet.

* * * * *